(12) United States Patent
Arakawa et al.

(10) Patent No.: US 7,411,412 B2
(45) Date of Patent: *Aug. 12, 2008

(54) SEMICONDUCTOR INTEGRATED CIRCUIT

(75) Inventors: Tomofumi Arakawa, Tokyo (JP); Mutsuhiro Ohmori, Kanagawa (JP)

(73) Assignee: Sony Corporation (JP)

( * ) Notice: Subject to any disclaimer, the term of this patent is extended or adjusted under 35 U.S.C. 154(b) by 67 days.

This patent is subject to a terminal disclaimer.

(21) Appl. No.: 11/499,730

(22) Filed: Aug. 7, 2006

(65) Prior Publication Data
US 2007/0057690 A1    Mar. 15, 2007

(30) Foreign Application Priority Data
Aug. 10, 2005   (JP) .............. P2005-231868

(51) Int. Cl.
H03K 19/003    (2006.01)
G06F 7/38    (2006.01)

(52) U.S. Cl. .............. 326/10; 326/9; 326/12; 326/13; 326/40; 326/113

(58) Field of Classification Search ............ 326/9–13, 326/37–41, 47
See application file for complete search history.

(56) References Cited

U.S. PATENT DOCUMENTS

| | | | | |
|---|---|---|---|---|
| 5,212,652 A | * | 5/1993 | Agrawal et al. | ............ 326/41 |
| 5,260,611 A | * | 11/1993 | Cliff et al. | ............ 326/39 |
| 5,825,197 A | * | 10/1998 | Lane et al. | ............ 326/10 |
| 6,166,559 A | * | 12/2000 | McClintock et al. | ...... 326/10 |
| 6,222,382 B1 | * | 4/2001 | Jefferson et al. | ........ 326/38 |
| 6,344,755 B1 | * | 2/2002 | Reddy et al. | ............ 326/10 |
| 6,594,183 B1 | | 7/2003 | Lofgren et al. | |
| 2004/0075461 A1 | * | 4/2004 | Nicolaidis | ............ 326/10 |

FOREIGN PATENT DOCUMENTS

JP    3192220 B    5/2001
JP    3491579 B    11/2003

* cited by examiner

Primary Examiner—Rexford Barnie
Assistant Examiner—Jany Tran
(74) Attorney, Agent, or Firm—Rader Fishman & Grauer PLLC; Ronald P. Kananen

(57) ABSTRACT

A semiconductor integrated circuit including: N modules set in their functions in accordance with input function setting data, a circuit block having R number of I/O parts, and a module selection part for selecting R number of modules from among the N number of modules connecting the selected R number of modules and R number of I/O parts of the circuit block and connecting one module selected from among at least two modules to each of the R number of I/O parts. Each of the R number of I/O parts has a data holding part for holding a function setting data and inputting the held function setting data to the destination module, and N modules are able to replace functions of each other when the input function setting data are the same.

32 Claims, 20 Drawing Sheets

SEMICONDUCTOR INTEGRATED CIRCUIT

CROSS REFERENCE TO RELATED APPLICATION

The present invention contains subject matter related to Japanese Patent Application No. 2005-231868 filed in the Japan Patent Office on Aug. 10, 2005, the entire contents of which being incorporated herein by reference.

BACKGROUND OF THE INVENTION

1. Field of the Invention

The present invention relates to a semiconductor integrated circuit having a plurality of modules able to replace functions of each other, more particularly relates to a semiconductor integrated circuit reducing the drop in yield due to a fault of modules.

2. Description of the Related Art

Recent semiconductor integrated circuits are being made increasingly smaller in processing dimensions and larger in size of circuits. The drop in yield due to defects in production has therefore become serious. Therefore, the technique of previously providing redundant circuits at parts of the entire circuit and replacing defective parts by the redundant circuits to thereby prevent an entire semiconductor chip from being discarded as defective is proposed.

For example, in the method of generation of data of a logical circuit of a field programmable gate array (FPGA) described in Japanese Patent No. 3491579, the necessity of circumventing a fault is judged from fault information and logical information, and if necessary, the logical information is changed so as to replace the function of the faulty part with that of a spare part.

Further, in the semiconductor device described in Japanese Patent No. 3192220, data is transferred among a plurality of circuit modules by memory map type addressing. An ID code is assigned to each circuit module, and the ID codes are processed to control the destination of transfer of the data and thereby replace a faulty circuit module by a redundant circuit module.

SUMMARY OF THE INVENTION

The above related art suffer from the following disadvantages however.

In the FPGA described in Japanese Patent No. 3491579, when a basic cell, the basic unit of configuration of the logical circuit, was faulty, the interconnect route was changed so as to bypass this. There are a variety of possible bypass interconnects for circumventing a fault in accordance with the situation of occurrence of the fault. It is difficult to predict to which interconnect route the interconnect route will be changed. For this reason, it is difficult to set a clear delay margin enabling a desired delay condition to be satisfied no matter which of the basic cells is faulty. It is necessary to anticipate a considerably large delay margin considering the possibility of a remarkable degradation of the delay characteristics.

In the semiconductor device described in Japanese Patent No. 319220, there is a possibility of a large change in the length of the distance of data transfer between circuit modules in accordance with the situation of occurrence of the fault, therefore it is necessary to define the operation of each module by assuming a case where all circuit modules are separated from each other by the maximum limit. Accordingly, it is necessary to anticipate a considerably large margin at the design stage, so the performance of the entire system is hard to optimize.

It is therefore desirable in the present invention to provide a semiconductor integrated circuit able to repair any defect occurring in the circuit to enable the overall circuit to operate normally and, at the same time, able to reduce a change of the signal delay accompanying the repair of a defect.

According to a first embodiment of the present invention, there is provided a semiconductor integrated circuit including: N (N indicates an integer larger than 2) number of modules set in their functions in accordance with input function setting data, a circuit block having R (R indicates an integer larger than 1, and smaller than N) number of input/output parts each of which outputs at least one signal to one module and receives at least one signal generated in the one module, and a module selection part for selecting R number of modules from among the N number of modules in accordance with an input control signal, connecting the selected R number of modules and R number of input/output parts of the circuit block in a one-to-one correspondence, and connecting one module selected in response to a control signal from among at least two modules to each of the R number of input/output parts. Each of the R number of input/output parts has a data holding part for holding the function setting data and inputting the held function setting data to the destination module. The N number of modules can replace functions of each other when the input function setting data are the same.

Preferably, the semiconductor integrated circuit according to the first embodiment of the invention may include a control part for generating a signal for controlling the module selection part so that a faulty module among the N number of modules is disconnected from the R number of input/output parts.

According to a second embodiment of the present invention, there is provided a semiconductor integrated circuit including: a plurality of modules arranged in a matrix having M number of rows and (N+1) number of columns (M indicate an integer of 1 or more, and N indicates an integer larger than 1), each of which is set in the function in accordance with an input function setting data, a circuit block having a plurality of input/output parts arranged in matrix having M number of rows and N number of columns, each of which outputs at least one signal to one module and receives at least one signal generated in that one module, and a module selection part for selecting M number of rows and N number of columns of modules obtained by excluding one column from among M number of rows and (N+1) number of columns of modules in response to the input control signal, connecting the selected M number of rows and N number of columns of modules and the M number of rows and N number of columns of input/output parts in a one-to-one correspondence, and connecting one module selected in response to a control signal from between two modules belonging to the same row to each of the input/output parts belonging to the same row. Each of the M number of rows and N number of columns of input/output parts has a data holding part for holding a function setting data and inputting that held function setting data to the destination module. The modules belonging to the same row can replace functions of each other when the input function setting data are the same.

Preferably, the semiconductor integrated circuit according to the second embodiment of the present invention may include a control part for generating a control signal of the module selection part so as to select M number of rows and N number of columns of modules excluding a column including a faulty module from among the M number of rows and (N+1) number of columns of modules.

According to the above first embodiment and second embodiment of the invention, it becomes possible to arrange two or more modules connected to the same input/output part so that the difference of distances from this input/output part becomes small. When the difference of distances between the input/output part and modules becomes small, the difference of interconnect lengths connecting the two becomes small, therefore the change of signal delay occurring when the connection between modules and the input/output parts is switched along with the repair of a defect etc. becomes small.

Further, even when a module connected to one input/output part is switched along with the repair of a defect etc., the functions of the modules connected to that one input/output part are always set to constant functions by the function setting data held in the data holding part provided in that one input/output part.

The data holding part may include a plurality of first interconnects for transmitting bit data of the function setting data to a destination module, a plurality of second interconnects for transmitting the plurality of bit data, and a plurality of vias for connecting any one of the plurality of second interconnects to any one of the plurality of first interconnects.

In this case, the first interconnects may be formed in a first interconnect layer, and the second interconnects may be formed in a second interconnect layer intersected to the first interconnect layer at right angles. The vias connects the first interconnects and the second interconnects.

Further, the data holding part may include a storage element enabling the stored data to be rewritten at least one time.

Further, each module may include a selection circuit for selecting one of a plurality of bit data of the function setting data in accordance with at least a part of the signal input from the input/output part and outputting that selected bit data or its logically inverted data to the input/output part.

The module selection part may select one of the modules of an i-th (i indicates an integer from 1 to N) column or modules of an (i+1)th column belonging to a k-th row (k indicates an integer from 1 to M) in response to the control signal and connect that selected module to the input/output part of the k-th row and the i-th column.

Further, N number of input/output parts belonging to each row may be arranged at equal intervals, and the module in the k-th row and the i-th column and the module in the k-th row and the (i+1)th column may be arranged at positions so that the distances from the input/output parts in the k-th row and the i-th column become equal to each other.

More preferably, the semiconductor integrated circuit has (N+1) number of power supply switch circuits each of which is inserted in a common power supply line of M number of modules belonging to each column and shuts off the supply of power to modules belonging to columns not connected to the input/output parts in response to the control signal.

Due to this, the power is no longer uselessly consumed in modules not connected to the input/output parts. Further, if shutting off the supply of power to faulty modules, the yield is improved.

Further, the circuit block and the module selection part may have wider intervals between interconnects belonging to the same interconnect layer in comparison with the M number of rows and (N+1) number of columns of modules, and the number of vias used for connecting interconnects belonging to different interconnect layers to each other may be made larger.

Due to this, the probability of an occurrence of a fault in the circuit block and the module selection part may be reduced, and the yield may be improved.

Further, in the M number of rows and (N+1) number of columns of modules, the density of circuit elements per unit area may be higher in comparison with the circuit block and the module selection part. Due to this, the area of the circuit may become smaller.

The semiconductor integrated circuit may include a storage part for storing a signal designating modules of one column to be disconnected from the M number of rows and N number of columns of input/output parts. In this case, the control part may generate the control signal in accordance with a signal stored in the storage part.

Further, the semiconductor integrated circuit may include a signal input part for receiving as input a signal designating modules of one column to be disconnected from the above M number of rows and N number of columns of input/output parts. In this case, the control part may generate the control signal in accordance with the signal input to the signal input part when inspecting.

Further, the control part may generate the control signal in accordance with the signal input to the signal input part when inspecting, and storing a signal designating a series of modules to be disconnected in response to the result of the inspection.

The module selection part may connect a signal input terminal of a module disconnected from all input/output parts to an interconnect having predetermined potential in response to the control signal. Due to this, the potential of a signal input terminal of a module not connected to any input/output part becomes stable.

Summarizing the effects of the invention, according to the present invention, a plurality of modules connected to the same input/output part can be arranged so that difference of distances from that input/output part becomes small, therefore the change of the signal delay occurring when the connections between the input/output parts and modules are switched along with the repair of a defect etc. can be made small.

Further, by setting the functions of a module by the function setting data held in the data holding part provided in the input/output part, it becomes possible to repair a defect of a module found by an inspection after production even when the function setting data held in the data holding part is fixed at the time of production.

BRIEF DESCRIPTION OF THE DRAWINGS

These and other objects and features of the present invention will become clearer from the following description of the preferred embodiments with reference to the attached drawings, wherein.

DESCRIPTION OF THE PREFERRED
EMBODIMENTS

First Embodiment

Figure 1:
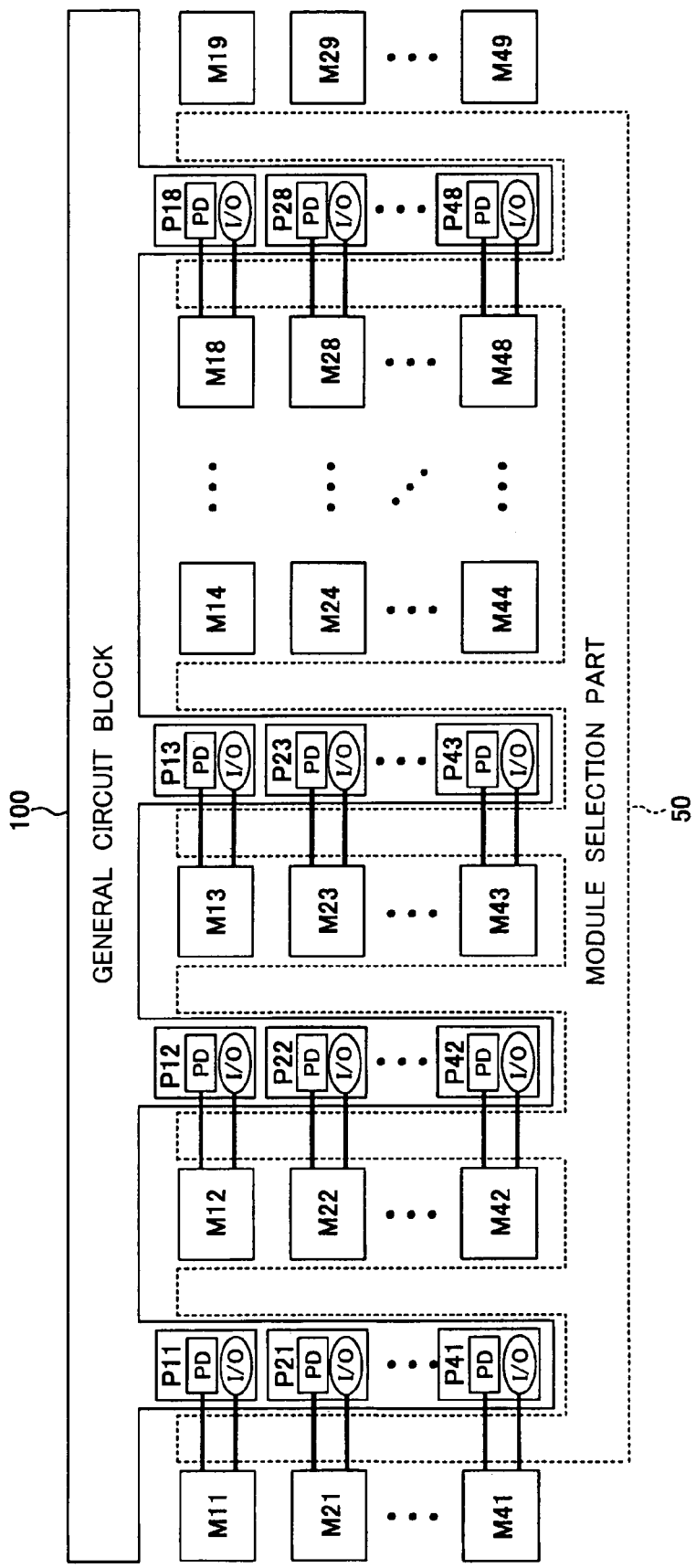
FIG. 1 is a diagram showing an example of the configuration of a semiconductor integrated circuit.

FIG. 1 is a diagram showing an example of the configuration of a semiconductor integrated circuit. The semiconductor integrated circuit according to the present embodiment, for example, as shown in FIG. 1, has modules M11 to M19, M21 to M29, M31 to M39, and M41 to M49, a general circuit block 100, and a module selection part 50.

The modules M11 to M19, M21 to M29, M31 to M39, and M41 to M49 are embodiments of modules of the present invention. The general circuit block 100 is an embodiment of the circuit block of the present invention. The module selection part 50 is an embodiment of the module selection part of the present invention.

The modules M11 to M19, M21 to M29, M31 to M39, and M41 to M49 are arranged in a matrix consisting of four rows and nine columns. Here, where "k" is an integer from 1 to 4, and "n" is an integer from 1 to 9, the module Mkn belongs to the k-th row and the n-th column.

The module Mkn is a circuit set in its functions in accordance with the input function setting data, that is, is a programmable circuit. The module Mkn may have any circuit configuration and functions and may include for example a circuit having a computation and processing function such as a digital signal processor (DSP) and a circuit for performing a simple logical computation. As the latter circuit, for example a selector SEL (FIG. 2) for selecting one of a plurality of bit data of the function setting data in accordance with at least a part of the signal input from the input/output part (mentioned later) and outputting the selected bit data or its logically inverted data to the input/output part may be employed.

Further, the module Mkn is not limited to a digital circuit and may be an analog circuit able to be set in functions in accordance with the function setting data.

Modules belonging to the same row can replace functions of each other when the input function setting data are the same. Namely, when the same function setting data is input to the modules Mk1 to Mk9 belonging to the k-th row, the functions of these modules become equivalent.

All of the modules Mk1 to Mk9 belonging to the same row may have the same circuit configuration or may include a module having a different circuit configuration in a part thereof so far as they can replace functions of each other when the same function setting data is input.

The general circuit block 100 has input/output parts P11 to P18, P21 to P28, P31 to P38, and P41 to P48 for transferring signals with the above modules M11 to M19, M21 to M29, M31 to M39, and M41 to M49 and executes predetermined processing in cooperation with these modules. The general circuit block 100 may have any circuit configuration and function and may be configured by for example only interconnects.

The input/output parts P11 to P18, P21 to P28, P31 to P38, and P41 to P48 are arranged in a matrix consisting of four rows and eight columns. Here, where "I" is an integer from 1 to 8, the input/output part Pki belongs to the k-th row and the i-th column.

Each of the input/output parts P11 to P18, P21 to P28, P31 to P38, and P41 to P48 outputs at least one signal to one module and receives as input at least one signal generated in that one module. In FIG. 1, a notation "I/O" indicates a signal transferred between the input/output part and a module other than the function setting data mentioned later.

Note that all of the input/output parts Pk1 to Pk8 belonging to the same row may input/output signals of the same combination or may include input/output parts of different types for receiving as input/outputting signals of different combinations. For example, when the module Mkn has three input/output terminals, input/output parts receiving as input signals from all of these three output terminals, input/output parts receiving as input the signal from only one output terminal, etc. may be mixed in the input/output parts Pk1 to Pk8.

Further, the input/output part Pki has a data holding part PD for holding the above function setting data. When the input/output part Pki is connected to one module by the module selection part 50 mentioned later, the data holding part PD provided in this input/output part Pki inputs the held function setting data to the destination module.

The data holding part PD may be able to hold at least data and may have any configuration.

For example, the data holding part PD may be a circuit configured by using interconnects such as vias and generating fixed data. In this case, the data holding part PD can be configured by using a plurality of interconnects LA (first interconnects), a plurality of interconnects LB (second interconnects), and a plurality of interconnects LC (third interconnects). The interconnects LA are interconnects for transmitting bit data of the function setting data to the destination module. The interconnects LB are interconnects for transmitting predetermined bit data. For example, they include interconnects for transmitting bit data of a constant value ("1", "0") such as the power supply lines and ground lines and interconnects for transmitting bit data set at any value by a circuit included in the general circuit block 100. The interconnects LC are interconnects for connecting any of a plurality of interconnects LB to each of the plurality of interconnects LA.

For example, the first interconnects LA are formed in a certain metal interconnect layer ML1, while the second interconnects LB are formed in a metal interconnect layer ML2 above this metal interconnect layer ML1. In this case, the third interconnects LC include vias penetrating through the two metal interconnect layers (ML1, ML2).

When the data holding part PD is configured by using interconnects in this way, the function setting data held in the data holding part PD cannot be changed after the production of semiconductor integrated circuit.

On the other hand, the data holding part PD may be configured by using various types of storage elements enabling rewriting of the storage data at least one time such as a static random access memory (SRAM), read only memory (ROM), flip-flip, and nonvolatile memory. When using a storage element for the data holding part PD, it becomes possible to rewrite the function setting data held in the data holding part PD even after producing the semiconductor integrated circuit.

Figure 2:
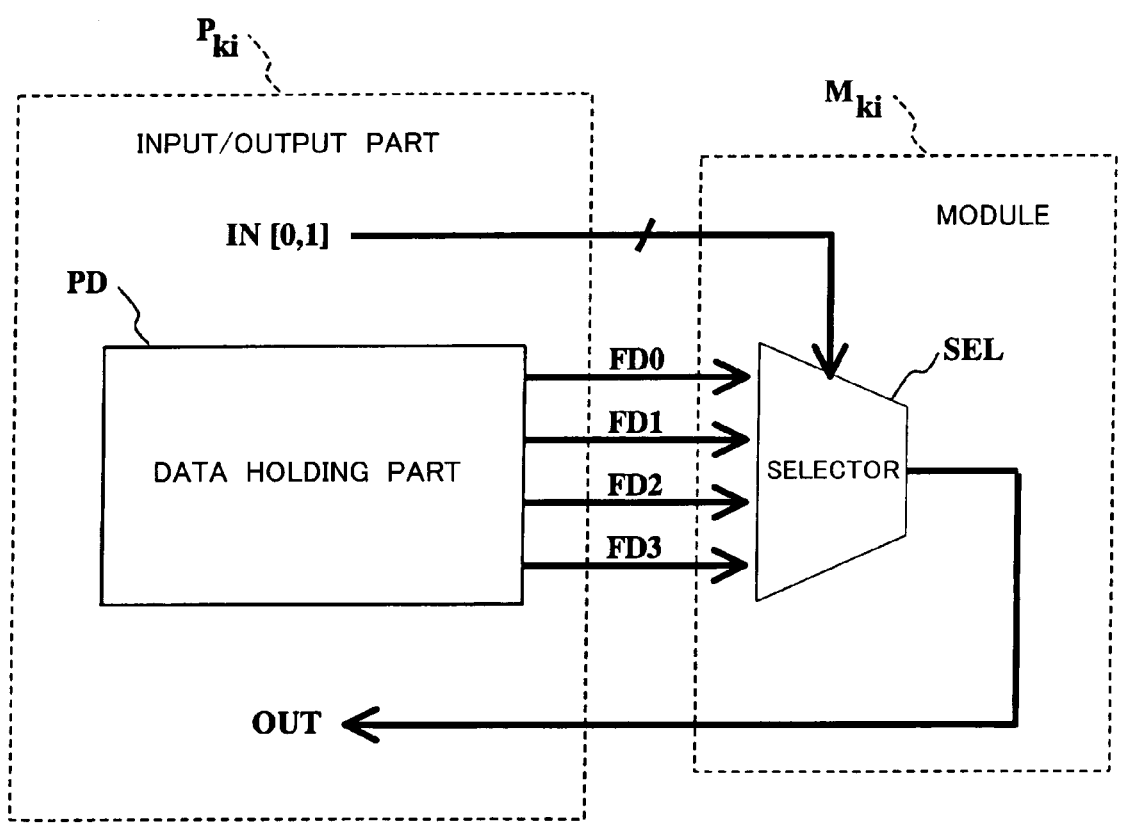
FIG. 2 is a diagram showing an example of the configuration of an input/output part and a module.

FIG. 2 is a diagram showing an example of the configuration of the input/output part and the module. The data holding part PD provided in the input/output part Pki holds for example 4 bits of function setting data (FD0, ,FD3) and inputs this function setting data to the module Mki connected by the module selection part 50 mentioned later. Further, the input/output part Pki outputs 2 bits of signals (IN0, IN1) to the module Mki via the module selection part 50 and receives as input the signal of 1 bit (OUT) from the module Mki via the module selection part 50. The module Mki has for example a selector SEL, selects one bit data from among bit data (FD0, ,FD3) input from the data holding part PD in response to signals IN0 and IN1, and outputs this as the signal OUT to the input/output part Pki.

In the example of FIG. 2, the data holding part PD and the selector SEL configure a 2-input and 1-output LookUp Table. In the semiconductor integrated circuit according to the present embodiment, for example as shown in FIG. 2, the data holding part and the selector forming components of the LookUp Table are separated, that is, the data holding part is arranged inside the input/output part, and the selector is arranged inside the module.

The module selection part 50 selects modules of four rows and eight columns obtained by excluding one column from among the above four rows and nine columns of modules in response to the control signal supplied from a not shown control part and connects that modules of four rows and eight columns and the above input/output parts of four rows and eight columns in a one-to-one correspondence. In this case, the module selection part 50 connects one module selected from between two modules belonging to the same row in response to the control signal to each of the input/output parts belonging to the same row. Namely, the module selection part 50 selects one of the module Mki or the module Mk(i+1) belonging to the k-th row and connects this to the input/output part Pki of the k-th row.

The module selection part 50 selects for example modules of four rows and eight columns obtained excluding a column including a faulty module (a specific column provided for redundancy when there is no faulty module) in response to a control signal supplied from the not shown control part.

When there is no faulty module, for example as shown in FIG. 1, the modules Mki and the input/output parts Pki are connected in a one-to-one correspondence, and all of the modules M19 to M49 belonging to the ninth column are disconnected from all input/output parts. In the following description, the module column disconnected from the input/output parts in a normal state when there is no faulty module in this way will be sometimes called a "redundant column".

Figure 3:
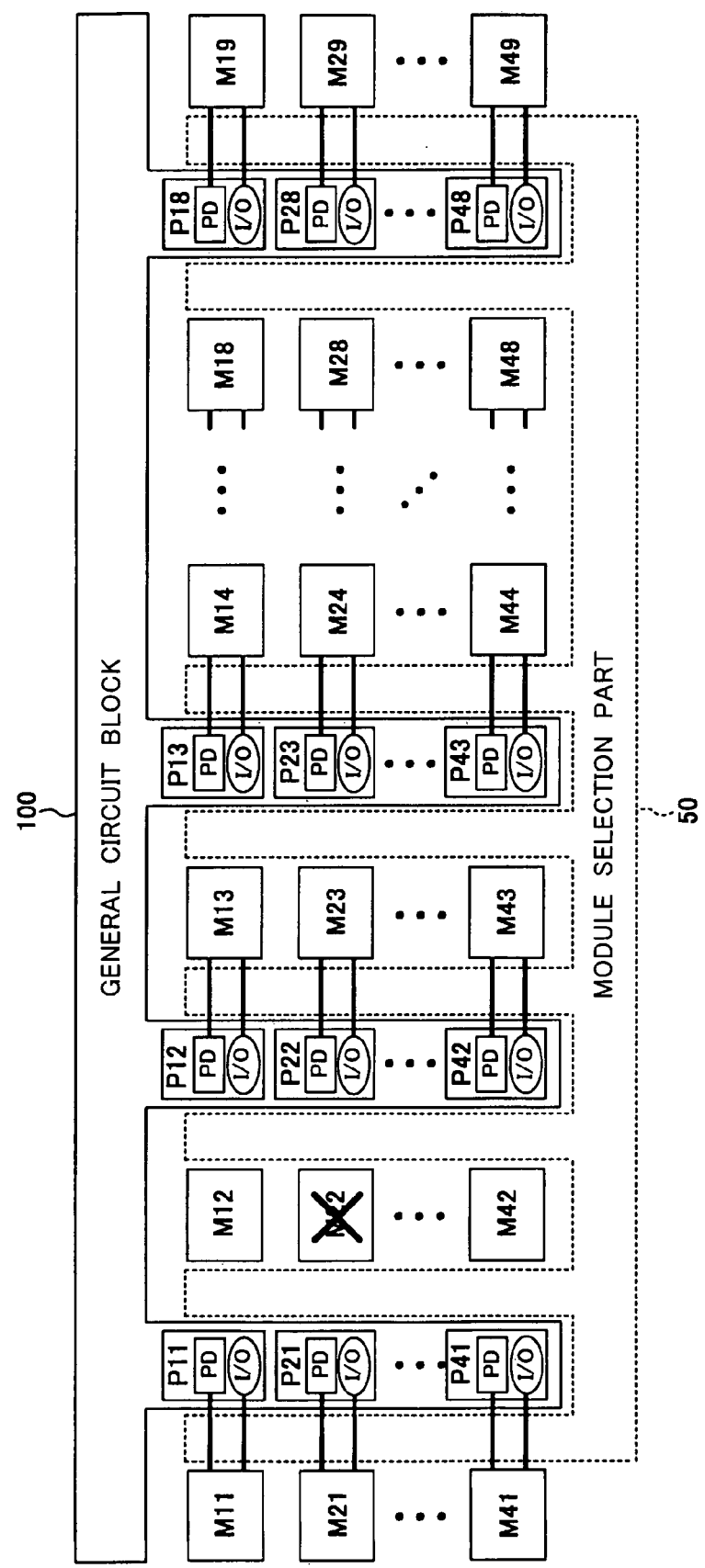
FIG. 3 is a diagram showing an example of repair of a defect in the semiconductor integrated circuit shown in FIG. 1.

FIG. 3 is a diagram showing an example of the repair of defect in the semiconductor integrated circuit shown in FIG. 1 and shows the connection state between the input/output part and the module in the case when the module M22 is faulty. When the module 22 is faulty, the not shown control part disconnects the modules M12 to M42 of the second column including the module 22 and the input/output parts P12 to P42 of the second column. The input/output parts P12 to P42 of the second column are connected to the modules M13 to M43 of the third column in place of the modules M12 to M42 of the second column, and the input/output parts P21 to P22 of the third column are connected to the modules M14 to M44 of the fourth column in place of the modules M13 to M43 of the third column. In this way, by sequential shifting of the destination of each input/output part to the direction of the redundant column (ninth column), the input/output parts of four rows and eight columns are connected with modules of four rows and eight columns excluding the second column in a one-to-one correspondence, and the defect of the module M22 is repaired.

Figure 4:
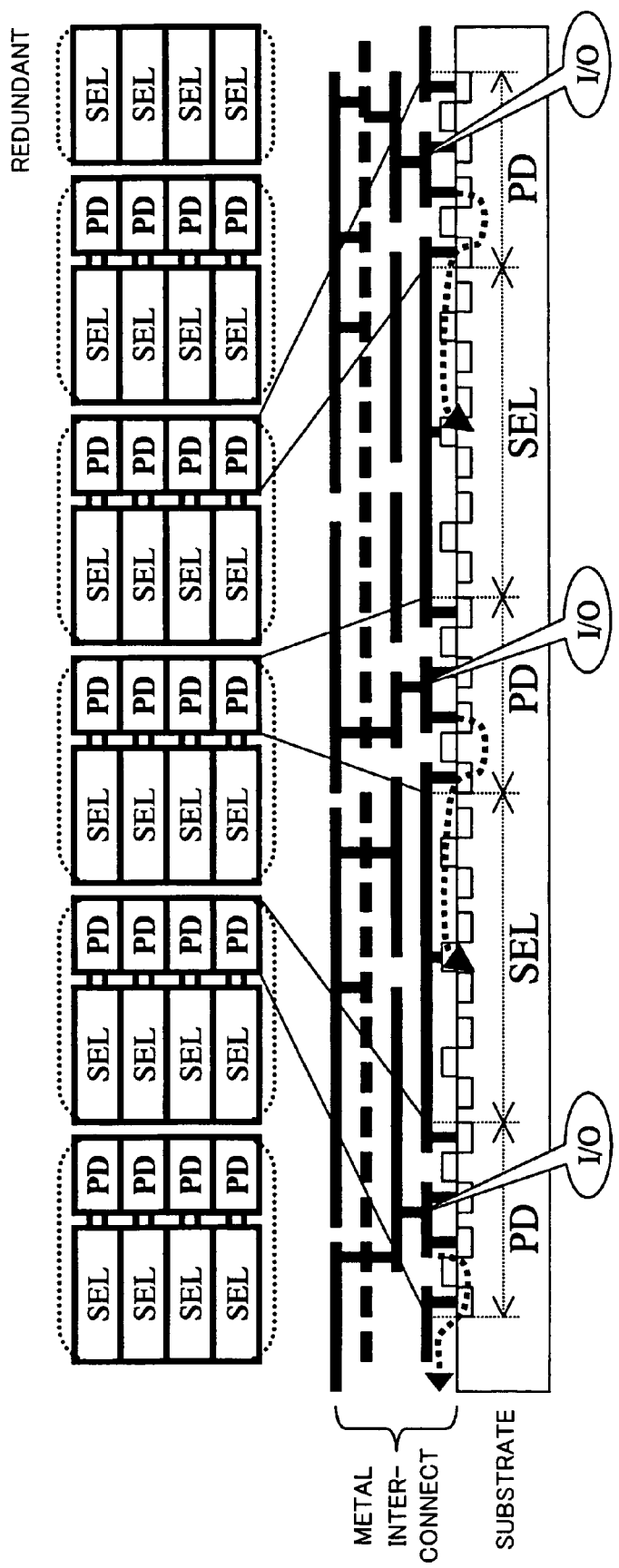
FIG. 4 is a first diagram for explaining the situation of a change of an input direction of function setting data along with the repair of a defect.
Figure 5:
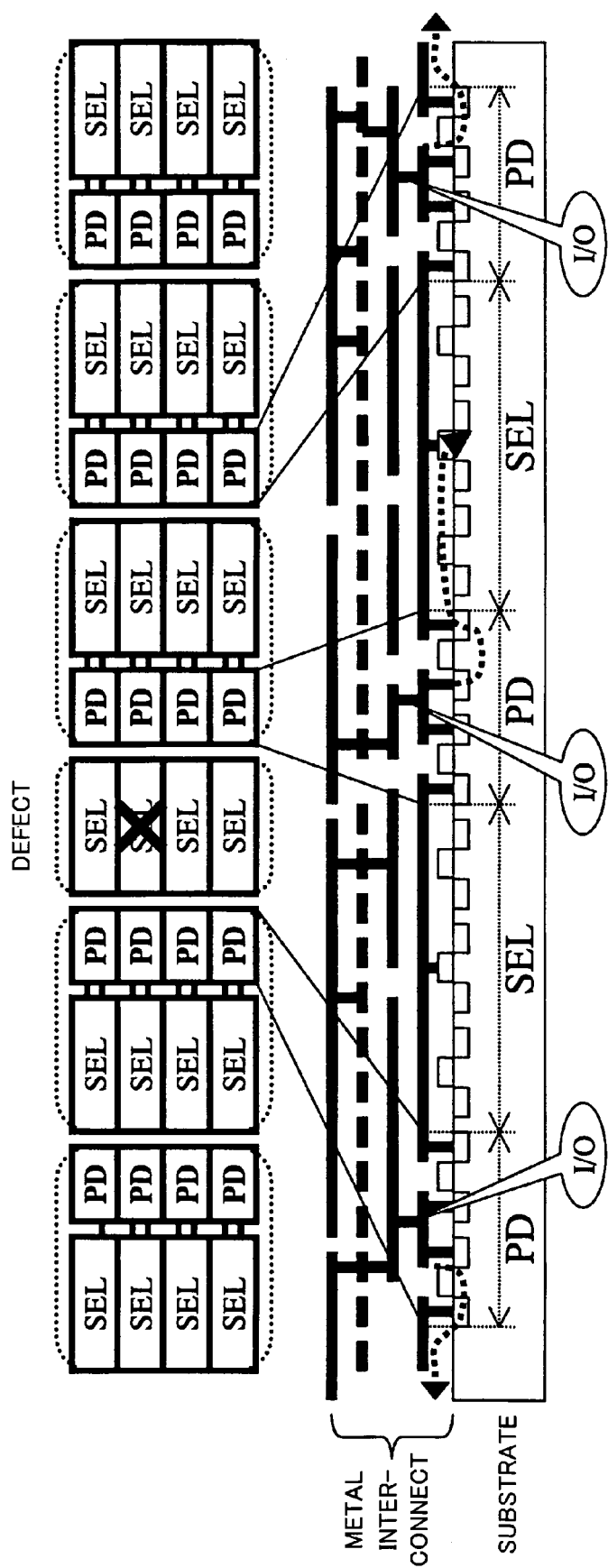
FIG. 5 is a second diagram for explaining the situation of the change of the input direction of function setting data along with the repair of a defect.

FIG. 4 and FIG. 5 are diagrams illustrating the situation of the change of the input direction of the function setting data along with the repair of a defect. The lower sides of the diagrams show cross-sections of the semiconductor integrated circuit shown in FIG. 1. When there is no defect module (FIG. 4), the data holding part PD of each input/output part inputs the function setting data to the selector SEL of the module located on the left in the figure. On the other hand, when there is a defect module (FIG. 5), the data holding part PD of each input/output part located on the right side from the column including that defect module inputs the function setting data to the selector SEL of the module located on the right of the figure. Due to this, the function of each module existing on the right side from the column including the defect module wholly shifts to the right side in comparison with that before the repair of the defect.

As explained above, according to the semiconductor integrated circuit shown in FIG. 1, modules of four rows and eight columns obtained by excluding one column from among four rows and nine columns of modules are selected, and these selected modules of four rows and eight columns and the input/output parts of four rows and eight columns are connected in a one-to-one correspondence. Further, to each of the input/output parts belonging to the same row, one module selected from between two modules belonging to the same row is connected. Due to this, it becomes possible to arrange two modules (Mki, Mk(i+1)) connected to the same input/output part Pki so that the difference of distances from the input/output part Pki becomes small. For example, as shown in FIG. 1, by arranging eight input/output parts (Pk1 to Pk8)

of each row at equal intervals, two modules (Mki, Mk(i+1)) can be arranged so that the distances from the input/output part Pki become equal with each other. By making the difference of distances between the input/output part and modules small, the difference of interconnect lengths connecting the two can be made small. Accordingly, the change of the signal delay occurring when switching the connection between the modules and the input/output parts along with the repair of a defect can be made small.

Further, it can be correctly predicted the degree of the change of the signal delay due to the repair of a defect based on the positional relationships between the modules Mki and Mk(i+1) and the input/output part Pki, therefore, in comparison with for example the case where the correct prediction is difficult as in the previously mentioned Japanese Patent No. 3491579, it becomes possible to estimate the delay margin as small. Due to this, a circuit operating at a high speed can be realized.

Further, according to the semiconductor integrated circuit shown in FIG. 1, a defect can be repaired by a simple circuit configuration of selecting one of two modules and connecting this to one input/output part, therefore an increase of circuits and generation of excessive power consumption can be suppressed to the minimum limit. For the switch circuit used for the switching of connection and the control part and for the storage part for holding the defect information, use can be made of circuits able to be designed and produced according to conventional general methods, therefore the increase of cost due to the provision of the defect repair function can be kept very small.

Further, according to the semiconductor integrated circuit shown in FIG. 1, the data holding part PD for holding the function setting data is provided in each input/output part, and the function setting data held in this data holding part PD is input via the module selection part to each module. The function of each module is set in accordance with the input function setting data. Due to this, even when the module connected to one input/output part is switched for the repair of a defect, the module connected to that one input/output part can be set to a constant function in accordance with the function setting data held in the data holding part PD.

When the connection between the input/output parts and the modules is switched along with repair of a defect, it is necessary to change the function of each module in accordance with the destination input/output part. For this reason, if the data holding part PD is provided inside the module, when repairing a defect, the function setting data of the data holding part PD must be rewritten in accordance with the destination input/output part. In order to accomplish this, for example, a method of configuring the data holding part PD by a rewritable storage element and a method of fixing the interconnects of the data holding part PD by an electron beam system after inspecting for defects of the module can be considered. However, with the method of configuring the data holding part PD by using a rewritable storage element, there are the disadvantages that the circuit configuration is more complicated in comparison with the method of fixing the interconnects by vias etc. and an increase of the circuit area and the rise of the fault rate are induced. Further, with the method of fixing the interconnects of the data holding part PD by the electron beam system or the like, there are the disadvantages that the conventional general production line can no longer can utilized and the production efficiency is lowered. As opposed to this, according to the semiconductor integrated circuit shown in FIG. 1, even when the connection between the input/output part and the module is switched, there is no need for changing the function setting data held in the data holding part PD, therefore the data holding part PD can be configured by fixed interconnects. Accordingly, the above disadvantages in the method of using the rewritable storage element and the method of fixing interconnects by using an electron beam system or the like can be avoided.

Further, there is no need at all of adding a circuit to the general circuit block 100 for the repair of defects, therefore it becomes possible to use a conventional circuit as it is, and the load of design due to the provision of the defect repair function can be reduced.

Further, by a structure of regularly arranging modules, it becomes easy to optimize the interval of interconnects, characteristics of elements, and so on, therefore the increase of the circuit area and the variation of circuit characteristics can be suppressed in comparison with the structure of arranging modules at random.

In addition, according to the semiconductor integrated circuit shown in FIG. 1, the connection states between input/output parts and modules can be controlled for each column all together, therefore it is possible to greatly decrease the number of control signals in comparison with the case where the connection states with input/output parts are independently controlled for individual modules, so the circuit configuration of the control part can be simplified.

Further, when inspecting for faults, the presence of any faults may be inspected for each column, therefore the inspection time can be shortened in comparison with the case where modules are inspected one by one.

Further, when writing the information of a fault module into the inside of a semiconductor integrated circuit by utilizing a storage element such as a fuse, the information of presence of any fault may be written for each column, therefore the amount of information becomes small and the time required for the write processing can be shortened.

Note that in the semiconductor integrated circuit according to the present embodiment, when there is a faulty module, all modules belonging to the same column as this are disconnected from the input/output parts, therefore normal modules also become useless. For this reason, when the probability of occurrence of faults is high, the number of modules which become useless tends to increase. However, in a case where the probability of occurrence of faults is not so high or in a case where a large amount of modules having relatively small size are provided, the circuit area required for achieving the same yield can be kept down in comparison with the method of control of the connection state for individual modules.

Further, in the semiconductor integrated circuit shown in FIG. 1, input/output parts (Pk1 to Pk8) of the same row are arranged on a straight line, but they may be arranged on a curved or a meandering line or may be arranged in a zigzag state. On any line, so far as the input/output parts Pk1 to Pk8 are arranged at equal intervals, it is possible to arrange two modules (Mki, Mk(i+1)) so that the distances from the input/output part Pki become equal with each other.

Second Embodiment

Next, an explanation will be given of a second embodiment.

In the semiconductor integrated circuit according to the first embodiment, the part for which a defect can be repaired (four rows and nine columns of modules) and the part for which a defect cannot be repaired (general circuit block 100) were separated. When a defect occurs in the part for which a defect cannot be repaired, the entire circuit must be discarded, therefore desirably the fault ratio of this part is made as low as possible. Therefore, in the semiconductor integrated circuit according to the second embodiment, for example the "design for manufacturing" (DFM) or other technique is used to make the part for which a defect cannot be repaired (general circuit block 100) resistant to faults in comparison with the part for which a defect can be repaired (four rows and nine columns of modules).

For example, in the general circuit block 100, the interconnect pattern is formed so that the interval between interconnects belonging to the same interconnect layer becomes broader in comparison with the four rows and nine columns of modules. Due to this, the probability of occurrence of faults due to short-circuiting of interconnects with each other can be reduced.

Further, in the general circuit block 100, in comparison with four rows and nine columns of modules, the number of vias used for connecting interconnects belonging to different interconnect layers with each other may be increased. For example, the countermeasure of connecting interconnects which are usually connected by one via by two vias is applied. Due to this, the probability of occurrence of a fault due to a missing via can be reduced.

Conversely, in the four rows and nine columns of modules, the density of circuit elements per unit area may be made higher in comparison with the general circuit block 100. The higher the density of the circuit elements, the higher the probability of occurrence of a fault, but in the four rows and nine columns of modules, the effect of defect repair can be expected, therefore there is no large influence upon the yield even when the fault becomes a little easier to occur if within a suitable range. Accordingly, by raising the density of circuit elements in the four rows and nine columns of modules, a reduction of area and higher performance of the overall circuit can be achieved without a large influence upon the yield.

Note that, the module selection part 50 may be included in the part for which a defect can be repaired mentioned above and may be included in the part for which a defect cannot be repaired.

When the module selection part 50 is included in the part for which a defect cannot be repaired, the same countermeasure as that for the general circuit block 100 is applied to the module selection part 50. Namely, the countermeasure of forming the interconnect pattern so that the interval of interconnects belonging to the same interconnect layer becomes broader in comparison with the four rows and nine columns of modules, the countermeasure of connecting the interconnects by using a larger number of vias in comparison with those for four rows and nine columns of modules, and so on are applied. Due to this, the reduction of the yield due to a fault of the module selection part 50 can be suppressed.

On the other hand, when the module selection part 50 is included in the part for which a defect cannot be repaired, the probability of occurrence of a fault becomes higher in comparison with the case where above countermeasure is carried out. As the case where a fault of the switch circuit influences the entire circuit, there can be mentioned for example a case where a circuit such as a switch provided in a route for receiving as input a signal to the general circuit block 100 is short-circuited and faulty and a signal of a constant voltage is continuously input to the general circuit block 100 from this faulty circuit. If such a fault does not occur that often, by including the module selection part 50 in the part for which a defect cannot be repaired, the pitch between interconnects and the number of vias can be reduced, therefore the area of the circuit can be reduced.

Third Embodiment

Next, an explanation will be given of a third embodiment.

Figure 6:
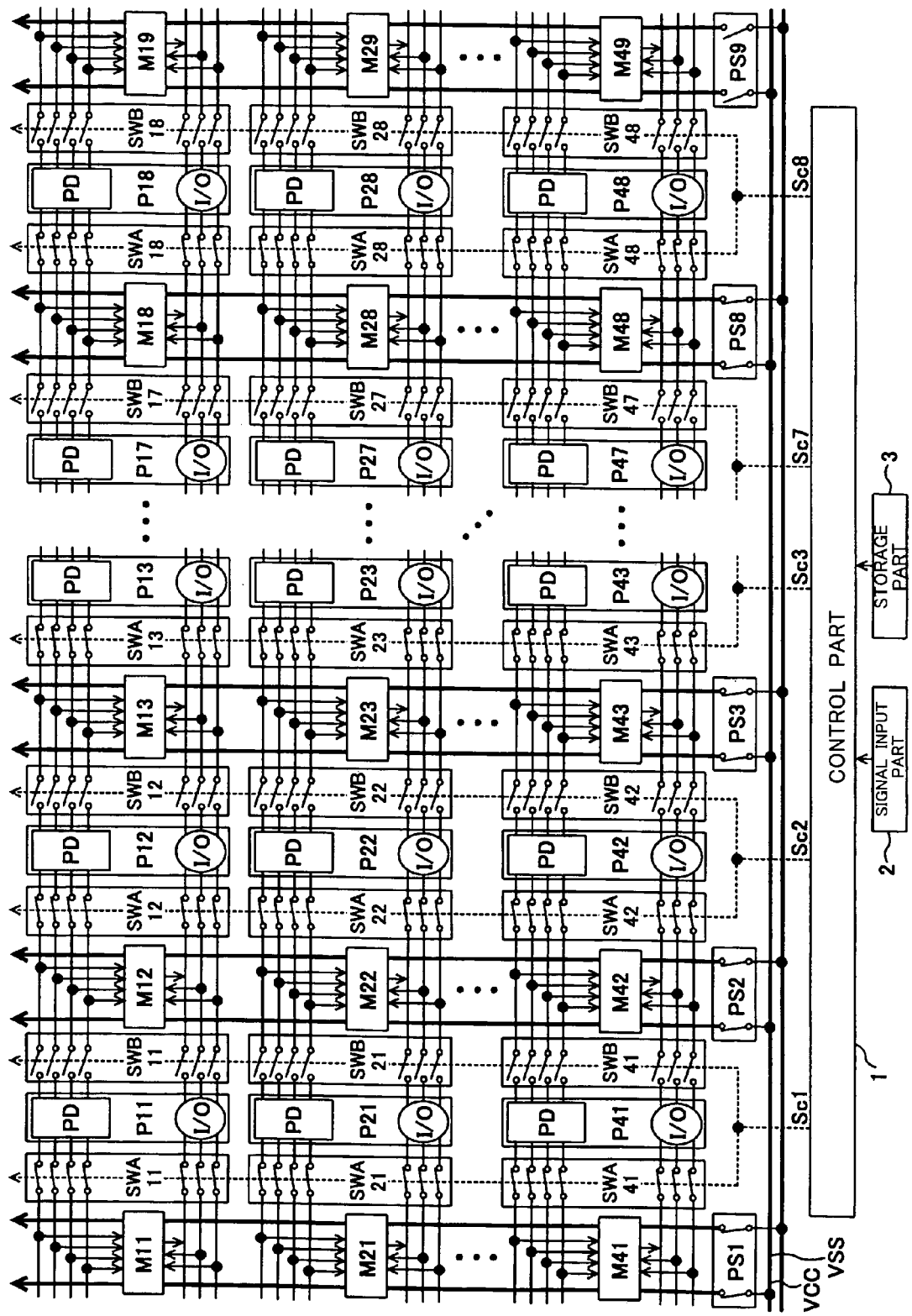
FIG. 6 is a diagram showing an example of the configuration of another semiconductor integrated circuit.

FIG. 6 is a diagram showing an example of the configuration of a semiconductor integrated circuit according to the third embodiment. The same notations of FIG. 1 and FIG. 6 indicate the same components. The semiconductor integrated circuit shown in FIG. 6 has four rows and nine columns of modules (M11 to M19, M21 to M29, M31 to M39, M41 to M49), four rows and eight columns of input/output parts (P11 to P18, P21 to P28, P31 to P38, and P41 to P48) provided in the general circuit block 100, switch circuits SWA11 to SWA18, SWA21 to SWA28, SWA31 to SWA38, SWA41 to SWA48, SWB11 to SWB18, SWB21 to SWB28, SWB31 to SWB38, and SWB41 to SWB48 included in the module selection part 50, power supply switch circuits PS1 to PS9, a control part 1, a signal input part 2, and a storage part 3.

The group of the switch circuits SWA11 to SWA18, SWA21 to SWA28, SWA31 to SWA38, and SWA41 to SWA48 is an embodiment of the first switch group of the present invention. The group of the switch circuits SWB11 to SWB18, SWB21 to SWB28, SWB31 to SWB38, and SWB41 to SWB48 is an embodiment of the second switch group of the present invention. The power supply switch circuits PS1 to PS9 are embodiments of the power supply switch circuit of the present invention. The control part 1 is an embodiment of the control part of the present invention. The signal input part 2 is an embodiment of the signal input part of the present invention. The storage part 3 is an embodiment of the storage part of the present invention.

In the semiconductor integrated circuit according to the present embodiment, modules Mkn (k=1, , 4, n=1, , 9) are programmable logical circuits each having two inputs (IN1 and IN2) and one output (OUT).

Figure 7:
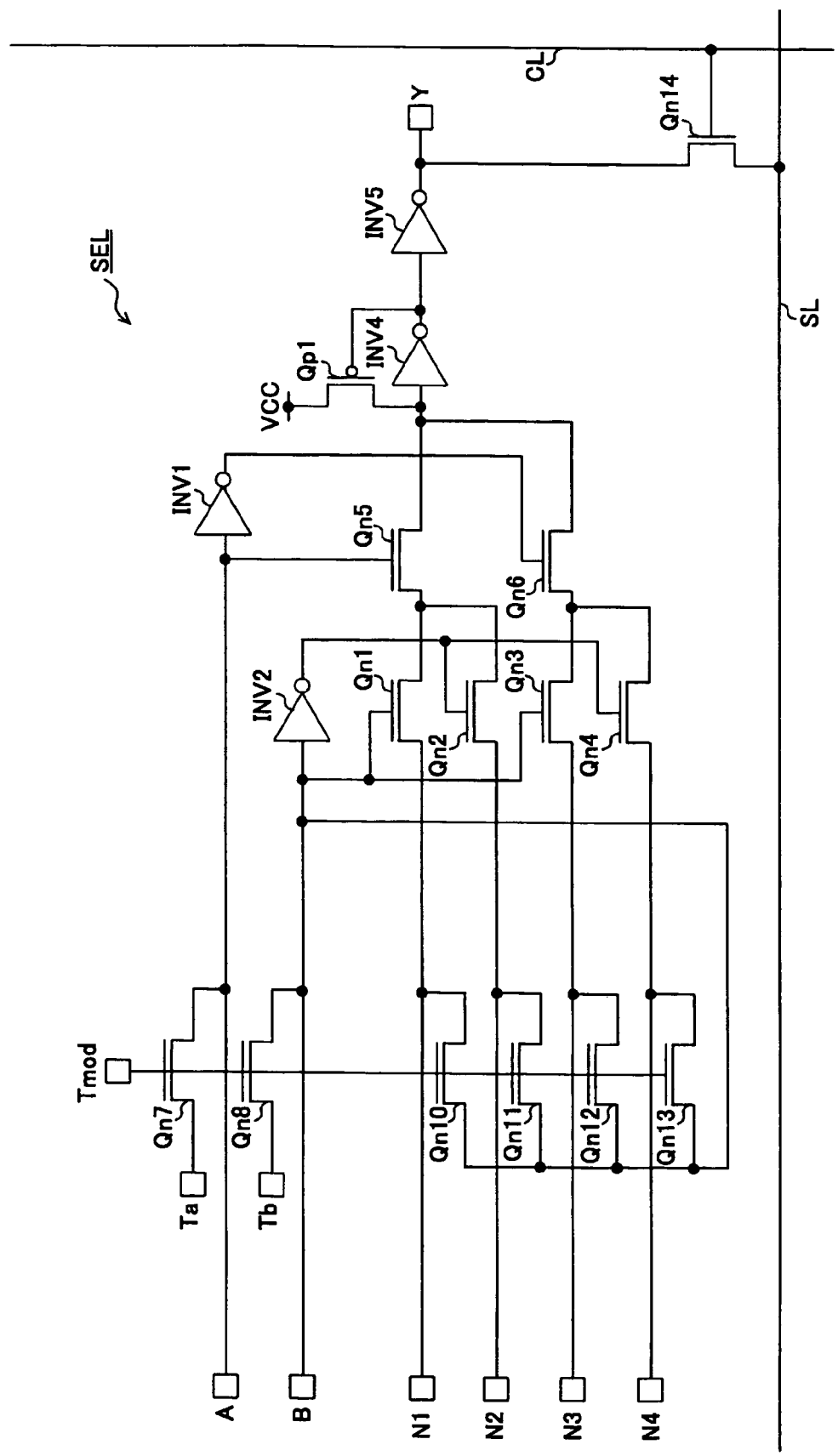
FIG. 7 is a diagram showing an example of the configuration of a module in the semiconductor integrated circuit shown in FIG. 6.

FIG. 7 is a diagram showing an example of the configuration of the module Mkn. The module Mkn shown in FIG. 7 has n-channel MOS type transistors Qn1 to Qn8 and Qn10 to Qn14, a p-channel MOS type transistor Qp1, and inverter circuits INV1, INV2, INV4, and INV5.

In the module Mkn shown in FIG. 7, the transistors Qn1 to Qn6 and Qp1 and inverter circuits INV1, INV2, INV3, INV4, and INV5 configure a 4-to-1 selector SEL. This selector SEL selects one of the nodes N1 to N4 in accordance with signals input to the input nodes A and B and outputs 1 bit of data (data of 1 bit of function setting data) input to the selected node to the output node Y.

A source of the transistor Qn1 is connected to the node N1, and its drain is connected via the transistor Qn5 to the input of the inverter circuit INV4. A source of the transistor Qn2 is connected to the node N2, and its drain is connected via the transistor Qn5 to the input of the inverter circuit INV4. A source of the transistor Qn3 is connected to the node N3, and its drain is connected via the transistor Qn6 to the input of the inverter circuit INV4. A source of the transistor Qn4 is connected to the node N4, and its drain is connected via the transistor Qn6 to the input of the inverter circuit INV4. The output of the inverter circuit INV4 is connected via the inverter circuit INV5 to the output node Y.

Gates of the transistors Qn1 and Qn3 are connected to the input node B. Gates of the transistors Qn2 and Qn4 are connected to the output of the inverter circuit INV2 for inverting the logic of the signal of the input node B. The gate of the transistor Qn5 is connected to the input node A. The gate of the transistor Qn6 is connected to the output of the inverter circuit INV1 inverting the logic of the signal of the input node A.

The transistor Qp1 pulls up the input of the inverter circuit INV4 when the output of the inverter circuit INV4 is at the low level. The source of the transistor Qp1 is connected to the power supply line VCC, its drain is connected to the input of the inverter circuit INV4, and its gate is connected to the output of the inverter circuit INV4.

Further, in the module Mkn shown in FIG. 7, transistors Qn7, Qn8, and Qn10 to Qn13 configure a circuit for receiving as input the test signal to the above selector SEL in an operation mode for inspecting the modules (hereinafter, called the "test mode").

A drain of the transistor Qn7 is connected to an input node Ta of the test signal, and its source is connected to the input node A. A drain of the transistor Qn8 is connected to an input node Tb of the test signal, and its source is connected to the input node B. Gates of the transistors Qn7 and Qn8 are commonly connected to a node Tmod set at a high level in the test mode.

A drain of the transistor Qn10 is connected to the node N1. A drain of the transistor Qn11 is connected to the node N2. A drain of the transistor Qn12 is connected to the node N3. A drain of the transistor Qn13 is connected to the node N4. Sources of the transistors Qn10 to Qn13 are commonly connected to the output of the inverter circuit INV2, and their gates are commonly connected to the node Tmod.

The transistor Qn14 outputs a signal indicating the test result of the above selector SEL to an inspection output line SL in the test mode. A drain of the transistor Qn14 is connected to the output node Y, its source is connected to the inspection output line SL, and its gate is connected to a column selection line CL. When the column selection line CL is set at the high level by the column selection circuit 10 mentioned later, the transistor Qn14 becomes the ON state and the output signal of the selector SEL output from the output node Y is output to the inspection output line SL via the transistor Qn14.

When the nodes A and B are used as the input and the node Y is used as the output, the logical function of the module Mkn shown in FIG. 7 is determined in accordance with the function setting data input to the input nodes N1 to N4.

For example, when the bit data "0", "1", "1", and "1" ("0" indicates the low level, and "1" indicates the high level) are input to the nodes N1, N2, N3, and N4, a two-input NAND circuit using the nodes A and B as the input and using the node Y as the output is realized. Namely, when the node A is at the low level, the transistor Qn6 turns on and, at the same time, one of transistors Qn3 or Qn4 turns on. For this reason, the input of the inverter circuit INV4 is driven to the high level via the transistors Qn3 and Qn6 or transistors Qn4 and Qn6, and the node Y becomes the high level. When the node B is at the low level, the transistors Qn2 and Qn4 turn on and, at the same time, the transistor Qn5 or Qn6 turns on. For this reason, the input of the inverter circuit INV4 is driven to the high level via the transistors Qn2 and Qn5 or transistors Qn4 and Qn6, and the node Y becomes the high level. When both of the nodes A and B are at the high level, the transistors Qn1 and Qn5 turn on, and the transistor Qn6 turns off, therefore the input of the inverter circuit INV4 is driven to the low level via the transistors Qn1 and Qn5, and the node Y becomes the low level. In this way, a NAND function where the output node Y becomes "1" (high level) when either of the input nodes A and B is "0" (low level) and the output node Y becomes "0" (low level) when both of the input nodes A and B are "1" (high level) is realized.

Further, in the test mode where the node Tmod is set at the high level, all of the transistors Qn7, Qn8, and Qn10 to Qn13 turn on. Due to this, to the input nodes A and B, predetermined inspection signals are input from the inspection use input nodes Ta and Tb. Further, input signals of the nodes N1 to N4 are all set at the high level or all set at the low level in accordance with the signal input from the node Tb. The logical function of the selector SEL is inspected to determine whether or not it is normal by comparing inspection signals input to the check use input nodes Ta and Tb and the signal of the inspection result output from the node Y. This ends the description for explaining the module Mkn.

In the semiconductor integrated circuit according to the present embodiment, the data holding part PD of each input/output part holds 4 bits of function setting data by the circuit configured by interconnects and vias.

Figure 8:
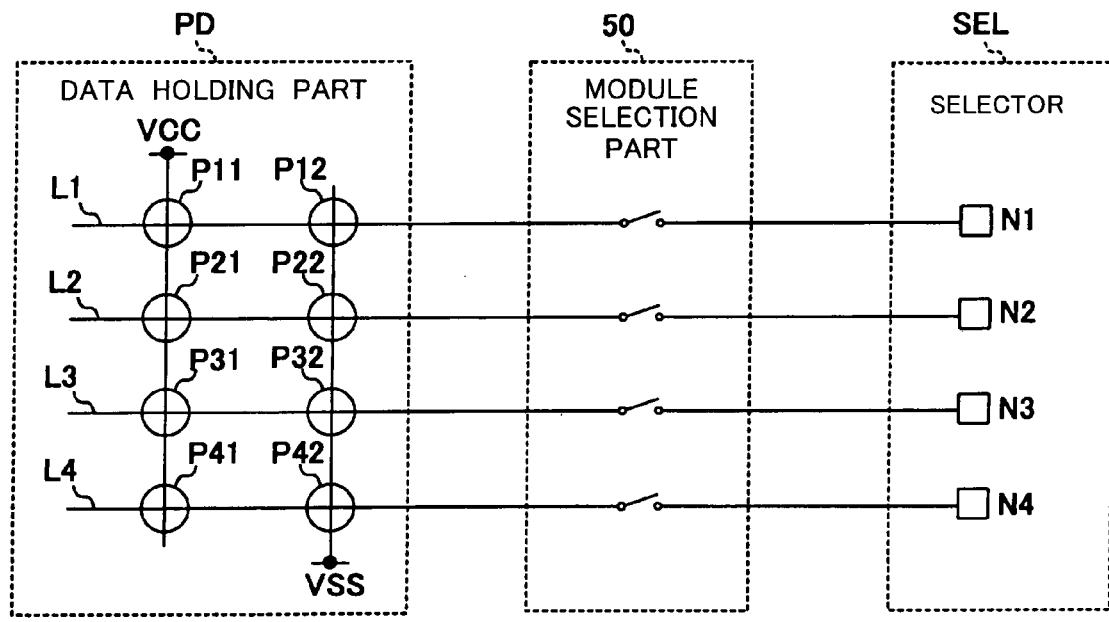
FIG. 8 is a diagram showing an example of the configuration of a data holding part in the semiconductor integrated circuit shown in FIG. 6.

FIG. 8 is a diagram showing an example of the configuration of the data holding part PD. Notations "P11", "P41", and "P12", "P42" in FIG. 8 indicate positions of formation of vias for receiving as input predetermined bit data to four interconnects L1 to L4. At the positions P11 to P41, vias for receiving as input the bit data having the value "1" to the interconnects L1 to L4 are formed. When forming vias at the positions P11 to P41, the interconnects L1 to L4 are connected to the interconnect for transmitting the bit data having the value "1", that is, the power supply line VCC. At the positions P12 to P42, vias for receiving as input the bit data having the value "0" to the interconnects L1 to L4 are formed. When forming vias at the positions P12 to P42, the interconnects L1 to L4 are connected to the interconnect for transmitting the bit data of "0", that is, the ground line VSS.

In the semiconductor integrated circuit according to the present embodiment, the module selection part 50 has two switch circuits for each input/output part.

The switch circuit SWAki is connected between the k-th row and the i-th column input/output part Pki and the k-th row and the i-th column module Mki, and turns on when the control signal Sci supplied from the control part 1 has the value "1", and turns off when the control signal Sci has the value "0".

The switch circuit SWBki is connected between the k-th row and the i-th column input/output part Pk and the k-th row and the (i+1)th column module Mk(i+1), turns off when the control signal Sci supplied from the control part 1 has the value "1", and turns on when the control signal Sci has the value "0".

The switch circuit SWAki has at least one circuit for turning on/off the signal Sin transmitted from the input/output part Pki to the module Mki and one circuit for turning on/off the signal Sout transmitted from the module Mki to the input/output part Pki. In the same way, the switch circuit SWBki has at least one circuit for turning on/off the signal Sin transmitted from the input/output part Pki to the module Mk(i+1) and one circuit for turning on/off the signal Sout transmitted from the module Mk(i+1) to the input/output part Pki. Below, a circuit for turning on/off an individual signal will be called a "switch element". Some examples of the configuration thereof will be explained.

Figure 9:
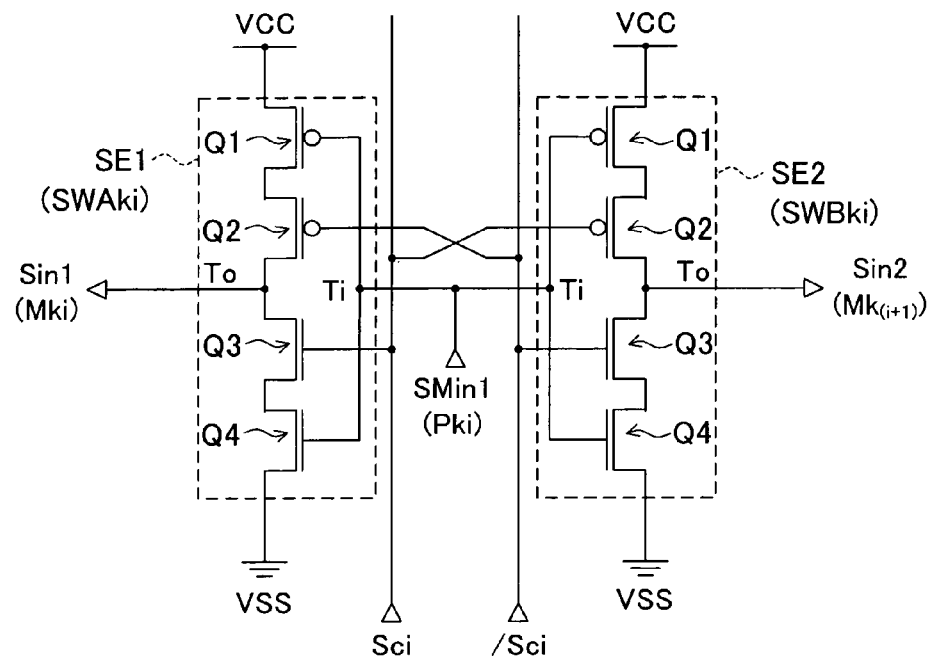
FIG. 9 is a diagram showing a first example of the configuration of a switch element for turning on/off a signal transmitted from an input/output part to a module.

FIG. 9 is a diagram showing a first example of the configuration of a switch element for turning on/off a signal transmitted from an input/output part to a module. The switch element SE1 shown in FIG. 9 is a circuit for turning on/off the signal Sin1 transmitted from the input/output part Pki to the module Mki and is included in the switch circuit SWAi.

The switch element SE1 has an input terminal Ti for receiving as input a signal from the input/output part Pki and an output terminal To for outputting a signal to the module Mki. When the control signal Sci has the value "1" (high level), the signal input to the input terminal Ti is logically inverted and output from the output terminal To, while when the control signal Sci has the value "0" (low level), the output terminal To is brought to the high impedance state.

The switch element SE2 shown in FIG. 9 is a circuit for turning on/off the signal Sin2 transmitted from the input/output part Pki to the module Mk(i+1) and is included in the switch circuit SWBki. The switch element SE2 has an input terminal Ti for receiving as input a signal from the input/output part Pki and an output terminal To for outputting a signal to the module Mki(i+1). When the control signal Sci has the value "0" (low level), the signal input to the input terminal Ti is logically inverted and output from the output terminal To, while when the control signal Sci has the value "1" (high level), the output terminal To is brought to the high impedance state. Further, when a signal indicating to disconnect the destination module Mk(i+1) from all input/output parts is input, the switch element SE2 connects the output terminal To to the ground line VSS.

Both of the switch elements SE1 and SE2 have four transistors (Q1 to Q4). The p-type MOS transistors Q1 and Q2 are connected in series between the power supply line VCC and the output terminal To, and the n-type MOS transistors Q3 and Q4 are connected in series between the output terminal To and the ground line VSS. To gates of the p-type MOS transistors Q1 and Q4, signals SMin1 from the input/output parts Pki are input.

In the switch element SE1, the control signal /Sci obtained by logically inverting the control signal Sci is input to the gate of the p-type MOS transistor Q2. The control signal Sci is input to the gate of the n-type MOS transistor Q3. On the other hand, in the switch element SE2, the above control signal Sci is input to the gate of the p-type MOS transistor Q2, and the control signal /Sci is input to the gate of the n-type MOS transistor Q3.

When the control signal Sci is at the high level (value "1"), the p-type MOS transistor Q2 and the n-type MOS transistor Q3 turn on in the switch element SE1, therefore the switch element SE1 operates as an inverter circuit. The signal SMin1 from the input/output part Pki is logically inverted by this inverter circuit and input to the module Mki. Further, the p-type MOS transistor Q2 and the n-type MOS transistor Q3 turn off in the switch element SE2, the output terminal To becomes the high impedance state, and the module Mk(i+1) and the input/output part Pki are disconnected. When the control signal Sci is at the low level (value "0"), converse to that explained above, the switch element SE2 operates as an inverter circuit. The signal SMin1 from the input/output part Pki is logically inverted by this inverter circuit and input to the module Mk(i+1). Further, the output terminal To becomes the high impedance state in the switch element SE1, and the module Mki and the input/output part Pki are disconnected.

Figure 10:
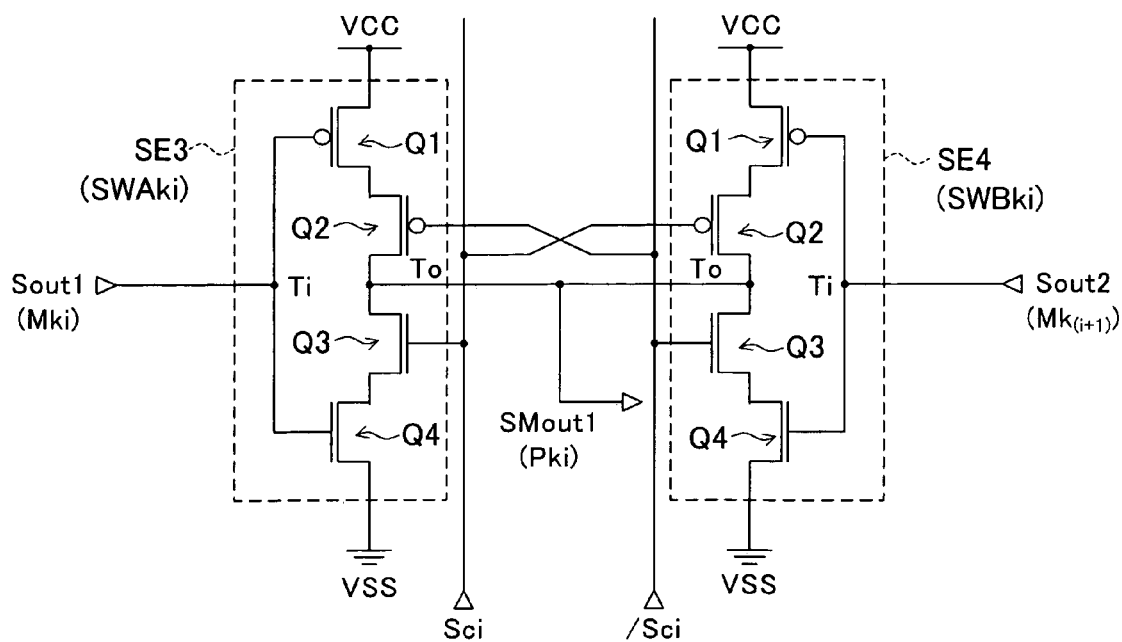
FIG. 10 is a diagram showing a first example of the configuration of a switch element for turning on/off a signal transmitted from a module to an input/output part.

FIG. 10 is a diagram showing a first example of the configuration of the switch element for turning on/off a signal transmitted from a module to an input/output part.

The switch element SE3 shown in FIG. 10 is a circuit turning on/off the signal Sout1 transmitted from the module Mki to the input/output part Pki and is included in the switch circuit SWAki. The switch element SE3 has an input terminal Ti for receiving as input a signal from the module Mki and an output terminal To for outputting a signal to the input/output part Pki. When the control signal Sci has the value "1" (high level), the signal input to the input terminal Ti is logically inverted and output from the output terminal To, while when the control signal Sci has the value "0" (low level), the output terminal To is brought to the high impedance state.

The switch element SE4 shown in FIG. 10 is a circuit for turning on/off the signal Sout2 transmitted from the module Mk(i+1) to the input/output part Pki and is included in the switch circuit SWBki. The switch element SE4 has an input terminal Ti for receiving as input a signal from the module Mk(i+1) and an output terminal To for outputting a signal to the input/output part Pki. When the control signal Sci has the value "0" (low level), the signal input to the input terminal Ti is logically inverted and output from the output terminal To, while when the control signal Sci has the value "1" (high level), the output terminal To is brought to the high impedance state.

The switch elements SE3 and SE4 have four transistors (Q1 to Q4) in the same way as the switch elements SE1 and SE2. The p-type MOS transistors Q1 and Q2 are connected in series between the power supply line VCC and the output terminal To, and the n-type MOS transistors Q3 and Q4 are connected in series between the output terminal To and the ground line VSS.

In the switch element SE3, the control signal /Sci is input to the gate of the p-type MOS transistor Q2, the control signal Sci is input to the gate of the n-type MOS transistor Q3, and signals Sout1 from the module Mki are input to gates of the p-type MOS transistors Q1 and Q4. On the other hand, in the switch element SE4, the control signal Sci is input to the gate of the p-type MOS transistor Q2, the control signal /Sci is input to the gate of the n-type MOS transistor Q3, and signals Sout2 from the module Mk(i+1) are input to the gates of the p-type MOS transistors Q1 and Q4.

When the control signal Sci is at the high level (value "1"), the p-type MOS transistor Q2 and the n-type MOS transistor Q3 turn on in the switch element SE3, and the switch element SE3 operates as an inverter circuit. The signal Sout1 from the module Mki is logically inverted by this inverter circuit and input to the input/output part Pki. Further, the p-type MOS transistor Q2 and the n-type MOS transistor Q3 turn off in the switch element SE4, the output terminal To becomes the high impedance state, and the module Mk(i+1) and the input/output part Pki are disconnected. When the control signal Sci is at the low level (value "0"), conversely to the above, the switch element SE4 operates as the inverter circuit. The signal Sout2 from the module Mk(i+1) is logically inverted by this inverter circuit and input to the input/output part Pki. In the switch element SE3, the output terminal To becomes the high impedance state, and the module Mki and the input/output part Pki are disconnected.

Figure 11:
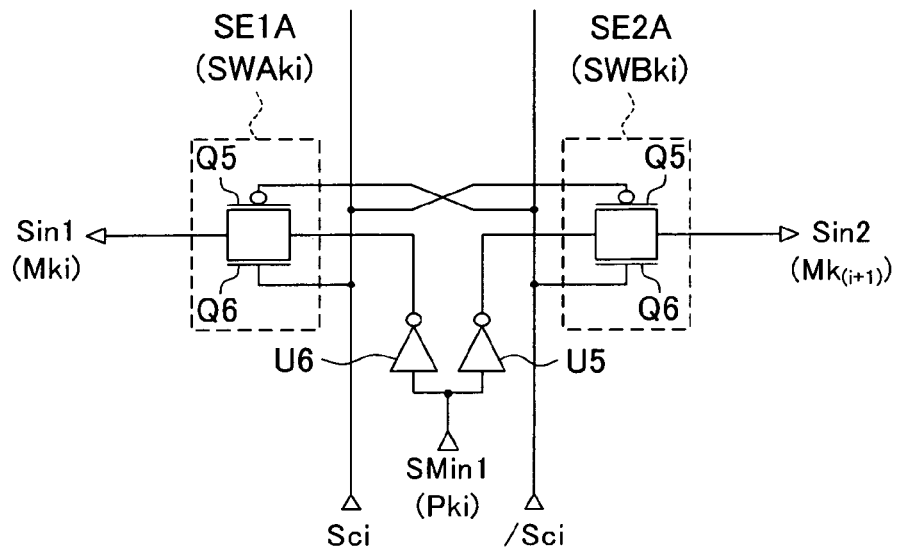
FIG. 11 is a diagram showing a second example of the configuration of a switch element for turning on/off a signal transmitted from an input/output part to a module.

FIG. 11 is a diagram showing a second example of the configuration of the switch element for turning on/off a signal transmitted from an input/output part to a module.

The switch element SE1A shown in FIG. 11 is, in the same way as the switch element SE1 shown in FIG. 9, a circuit for turning on/off the signal Sin1 transmitted from the input/output part Pki to the module Mki and is included in the switch circuit SWAki. The switch element SE1A has a transmission gate circuit inserted in the route for transmitting a signal from an input/output part Pki to a module Mki. This transmission gate circuit is configured by the p-type MOS transistor Q5 and the n-type MOS transistor Q6 connected in parallel.

The switch element SE2A shown in FIG. 11 is, in the same way as the switch element SE2 shown in FIG. 9, a circuit for turning on/off the signal Sin2 transmitted from the input/output part Pki to the module Mk(i+1) and is included in the switch circuit SWBki. The switch element SE2A has a transmission gate circuit inserted in the route for transmitting a signal from the input/output part Pki to the module Mk(i+1). This transmission gate circuit is, in the same way as the switch element SE1A, configured by a parallel connected p-type MOS transistor Q5 and n-type MOS transistor Q6.

In the switch element SE1A, the control signal /Sci is input to the gate of the p-type MOS transistor Q5, and the control signal Sci is input to the gate of the n-type MOS transistor Q6. On the other hand, in the switch element SE2A, the control signal Sci is input to the gate of the p-type MOS transistor Q5, and the control signal /Sci is input to the gate of the n-type MOS transistor Q6.

When the control signal Sci is at the high level (value "1"), the p-type MOS transistor Q5 and the n-type MOS transistor Q6 of the switch element SE1A are driven to ON, and the switch element SE1A becomes the conductive state. The signal SMin1 output from the input/output part Pki is input via the switch element SE1A to the module Mki. Further, the p-type MOS transistor Q5 and the n-type MOS transistor Q6 of the switch element SE2A are driven to OFF, the switch element SE2A becomes the shut off state, and the module Mk(i+1) and the input/output part Pki are disconnected. When the control signal Sci is at the low level (value "0"), converse to the above, the switch element SE2A becomes the conductive state. The signal SMin1 output from the input/output part Pki is input via the switch element SE2A to the module Mk(i+1). Further, the switch element SE1A becomes the shut off state, and the module Mki and the input/output part Pki are disconnected.

Note that, in the example of FIG. 11, in order to enhance the signal delay due to the resistance component of the transmission gate circuit, inverter circuits U5 and U6 are inserted in the route on the input side (input/output part side) of the switch elements SE1A and SE2A.

Figure 12:
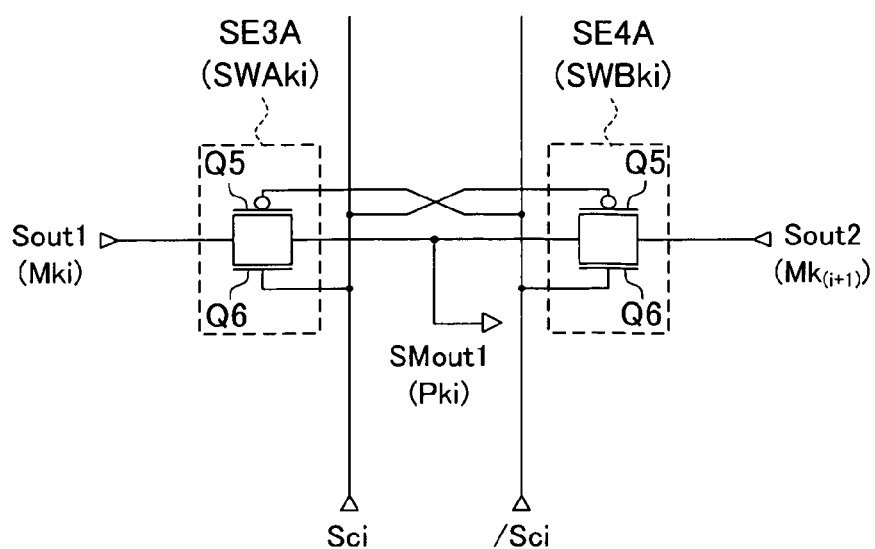
FIG. 12 is a diagram showing a second example of the configuration of a switch element for turning on/off a signal transmitted from a module to an input/output part.

FIG. 12 is a diagram showing a second example of the configuration of the switch element for turning on/off the signal transmitted from the module to the input/output part.

A switch element SE3A shown in FIG. 12 is, in the same way as the switch element SE3 shown in FIG. 10, a circuit for turning on/off the signal Sout1 transmitted from the module Mki to the input/output part Pki and is included in the switch circuit SWAki. The switch element SE3A has a transmission gate circuit inserted in the route for transmitting a signal from the module Mki to the input/output part Pki. This transmission gate circuit is configured by the p-type MOS transistor Q5 and the n-type MOS transistor Q6 connected in parallel.

A switch element SE4A shown in FIG. 12 is, in the same way as the switch element SE4 shown in FIG. 10, a circuit for turning on/off the signal Sout2 transmitted from the module Mk (i+1) to the input/output part Pki and is included in the switch circuit SWBki. The switch element SE4A has a transmission gate circuit inserted in the route for transmitting a signal from the module Mk(i+1) to the input/output part Pki. This transmission gate circuit is configured, in the same way as the switch element SE3A, by the p-type MOS transistor Q5 and the n-type MOS transistor Q6 connected in parallel.

In the switch element SE3A, the control signal/ Sci is input to the gate of the p-type MOS transistor Q5, and the control signal Sci is input to the gate of the n-type MOS transistor Q6. On the other hand, in the switch element SE4A, the control signal Sci is input to the gate of the p-type MOS transistor Q5, and the control signal/ Sci is input to the gate of the n-type MOS transistor Q6.

When the control signal Sci is at the high level (value "1"), the p-type MOS transistor Q5 and the n-type MOS transistor Q6 of the switch element SE3A are driven to ON, and the switch element SE1A becomes the conductive state. The signal Sout1 output from the module Mki is input via the switch element SE3A to the input/output part Pki. Further, the p-type MOS transistor Q5 and the n-type MOS transistor Q6 of the switch element SE4A are driven to OFF, the switch element SE4A becomes the conductive state, and the module Mk(i+1) and the input/output part Pki are disconnected. When the control signal Sci is at the low level (value "0"), the switch element SE4A becomes the conductive state converse to that mentioned above. The signal Sout2 output from the module Mk(i+1) is input via the switch element SE4A to the input/output part Pki. Further, the switch element SE3A becomes the shut off state, and the module Mki and the input/output part Pki are disconnected.

Note that, in order to reduce the signal delay due to the resistance component of the transmission gate circuit, an inverter circuit maybe inserted in the route on the input side (module side) of the switch elements SE1A and SE2A.

Figure 13:
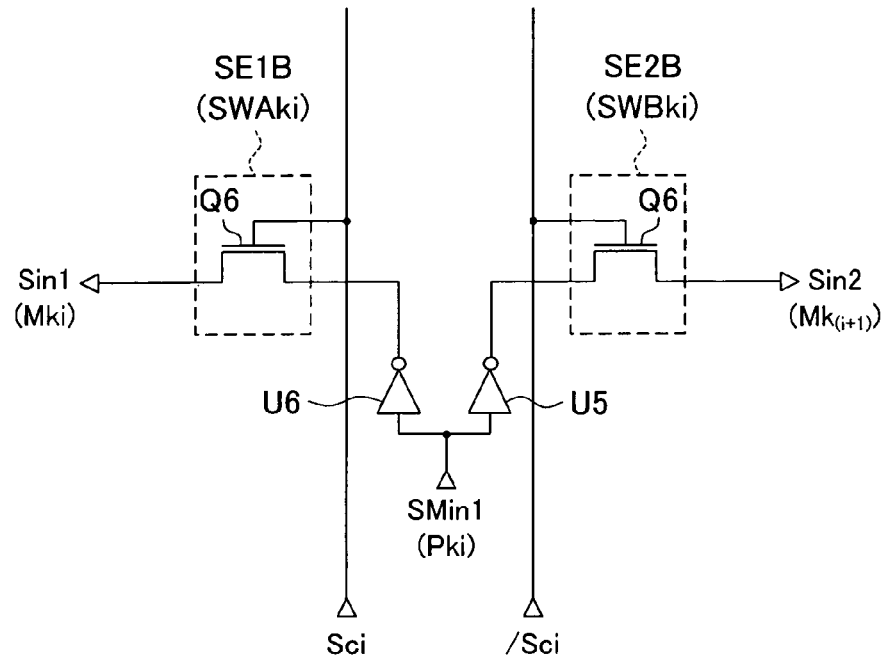
FIG. 13 is a diagram showing a third example of the configuration of a switch element for turning on/off a signal transmitted from an input/output part to a module.

FIG. 13 is a diagram showing a third example of the configuration of a switch element for turning on/off a signal transmitted from an input/output part to a module.

Switch elements SE1B and SE2B shown in FIG. 13 are obtained by deleting p-type MOS transistors Q5 of the switch elements SE1A and SE2A shown in FIG. 11. The basic operation is the same as that of the switch elements SE1A and SE2A. Namely, when the control signal Sci is at the high level (value "1"), the signal from the input/output part Pki is transmitted to the module Mki, and the input/output part Pki and the module Mk(i+1) are disconnected. When the control signal Sci is at the low level (value "0"), the signal from the input/output part Pki is transmitted to the module Mk(i+1), and the input/output part Pki and the module Mki are disconnected.

Figure 14:
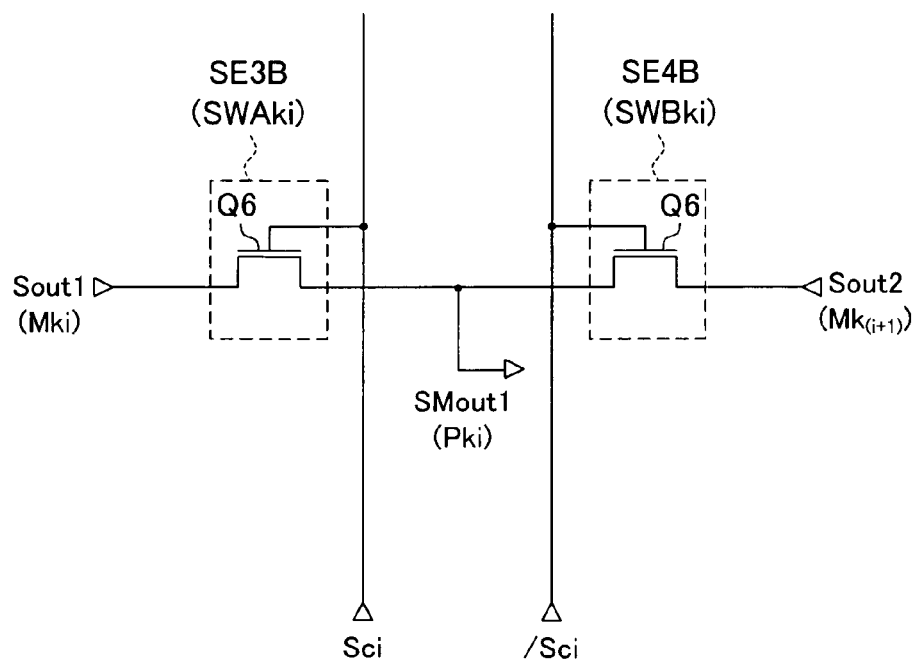
FIG. 14 is a diagram showing a third example of the configuration of a switch element for turning on/off a signal transmitted from a module to an input/output part.

FIG. 14 is a diagram showing a third example of the configuration of a switch element for turning on/off a signal transmitted from a module to an input/output part.

Switch elements SE3B and SE4B shown in FIG. 14 are obtained by deleting p-type MOS transistors Q5 of the switch elements SE3A and SE4A shown in FIG. 12. The basic operation is the same as that of the switch elements SE3A and SE4A. Namely, when the control signal Sci is at the high level (value "1"), the signal from the module Mki is transmitted to the input/output part Pki, and the input/output part Pki and the module Mk(i+1) are disconnected. When the control signal Sci is at the low level (value "0"), the signal from the module Mki(i+1) is transmitted to the input/output part Pki, and the input/output part Pki and the module Mki are disconnected.

Note that when signals of the high level are input to the switch elements (SE1B, SE2B, SE3B, SE4B) shown in FIG. 13 and FIG. 14, the signals passing through these switch elements and output cause a voltage drop corresponding to the threshold value of the n-type MOS transistor Q6. For this reason, when the switch elements shown in FIG. 13 and FIG. 14 are used, it is required that the influence by this voltage drop upon the circuit operation (delay, noise margin, etc.) be contained in a permissible range.

Figure 15A:
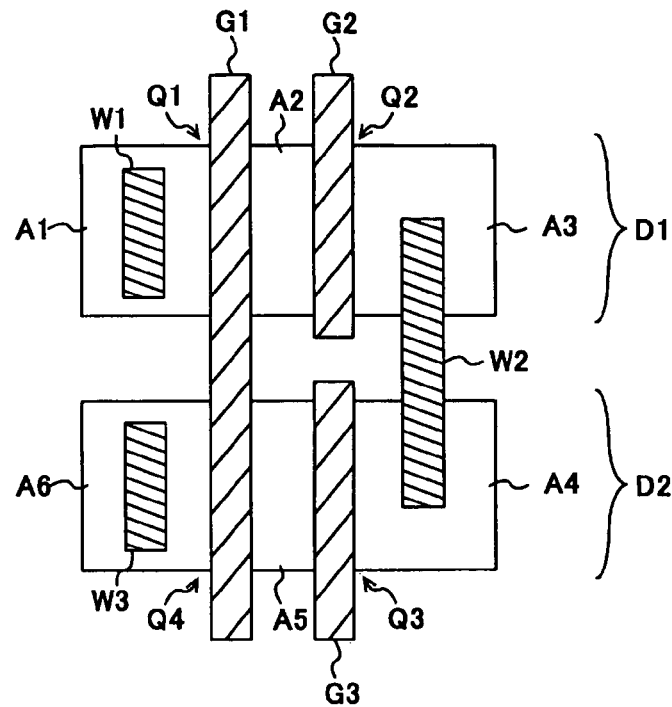
FIGS. 15A and 15B are plan views showing a structural example of a switch element of the first example of the configuration shown in FIG. 9 and FIG. 10.
Figure 15B:
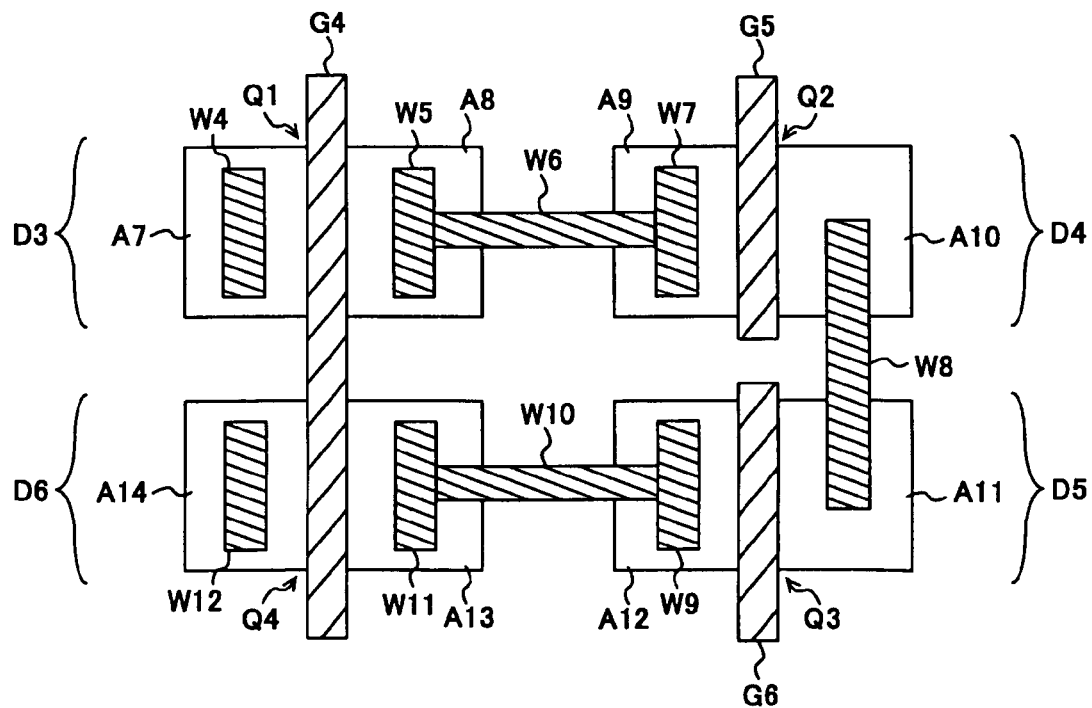

Here, an explanation will be given of the structure in a case where the switch elements of the first example of the configuration (FIG. 9 and FIG. 10) and the second example of the configuration (FIG. 11 and FIG. 12) are formed on the semiconductor substrate with reference to FIGS. 15A and 15B and FIGS. 16A and 16B. FIGS. 15A and 15B are plan views showing a structural example of the switch elements (SE1 to SE4) of the first example of the configuration shown in FIG. 9 and FIG. 10. FIG. 15A shows an example of a case where two MOS transistors each are formed in two active regions (D1, D2), and FIG. 15B shows an example of a case where one MOS transistor each is formed in four active regions (D3 to D6).

In the structural example shown in FIG. 15A, the active regions D1 and D2 are formed on the semiconductor substrate in a line. n-type impurities are introduced into the active region D1, and p-type impurities are introduced into the active region D2. The active regions D1 and D2 have for example rectangular shapes as shown in FIG. 15A and almost the same sizes. Between the active regions, a region for electrically isolating elements of different active regions from each other (element isolation region) is provided.

On the active regions D1 and D2, gate electrodes G1 to G3 are provided via not shown gate oxide films.

The gate electrode G1 is provided over two active regions (D1, D2). In the active region D1, in a part facing the gate electrode G1, a channel of the p-type MOS transistor Q1 is formed. Further, in the active region D2, a channel of the n-type MOS transistor Q4 is formed in the part facing the gate electrode G1. The gate electrode G1 corresponds to the input terminals Ti in the switch elements (SE1 to SE4) of the first example of the configuration.

The gate electrode G2 is provided on the active region D1 on the right side of the gate electrode G1 in the figure. In the active region D1, a channel of the p-type MOS transistor Q2 is formed in the part facing the gate electrode G2. The gate electrode G3 is provided on the active region D2 on the right side of the gate electrode G1 in the figure. In the active region D2, a channel of the n-type MOS transistor Q3 is formed in the part facing the gate electrode G3. The gate electrodes G2 and G3 correspond to a terminal for receiving as input the control signal Sci or its logically inverted signal/ Sci.

In the active region D1, a region A1 on the left side of the gate electrode G1 corresponds to the source of the p-type MOS transistor Q1. This region A1 is connected via a not shown via to a metal interconnect W1. The metal interconnect W1 corresponds to the power supply line VCC.

In the active region D1, a region A2 sandwiched between the gate electrodes G1 and G2 corresponds to the drain of the p-type MOS transistor Q1 and the source of the p-type MOS transistor Q2. The drain of the p-type MOS transistor Q1 and the source of the p-type MOS transistor Q2 are connected to each other in this region A2.

In the active region D1, a region A3 on the right side of the gate electrode G2 corresponds to the drain of the p-type MOS transistor Q2. Further, in the active region D2, a region A4 on the right side of the gate electrode G3 corresponds to the drain of the n-type MOS transistor Q3. These regions A3 and A4 are connected to each other via not shown vias and a metal interconnect W2. A connecting point of the regions A3 and A4 corresponds to the output terminals To in the switch elements (SE1 to SE4) of the first example of the configuration.

In the active region D2, a region A5 sandwiched between the gate electrodes G1 and G3 corresponds to the source of the n-type MOS transistor Q3 and the drain of the n-type MOS transistor Q4. The source of the n-type MOS transistor Q3 and the drain of the n-type MOS transistor Q4 are connected to each other in this region A5.

In the active region D2, a region A6 on the left side of the gate electrode G1 corresponds to the source of the n-type MOS transistor Q4. This region A6 is connected via a not shown via to a metal interconnect W3. The metal interconnect W3 corresponds to the ground line VSS.

In the structural example shown in FIG. 15B, on the semiconductor substrate, four active regions D3, D4, D5, and D6 are formed in a matrix. In the example of FIG. 15B, the active region D4 is formed on the right side of the active region D3, the active region D6 is formed on the lower side of the active region D3, and the active region D5 is formed on the lower side of the active region D4 and right side of the active region D6. n-type impurities are introduced into the active regions D3 and D4, and p-type impurities are introduced into the active regions D5 and D6. The active regions D3 to D6 have for example rectangular shapes as shown in FIG. 15B and almost the same sizes. An element isolation region is provided between active regions.

On the active regions D3 to D6, gate electrodes G4 to G6 are provided via not shown gate oxide films.

The gate electrode G4 is provided over the active regions D3 and D6. In the active region D3, in the part facing the gate electrode G4, a channel of the p-type MOS transistor Q1 is formed. Further, in the active region D6, in the part facing the gate electrode G4, a channel of the n-type MOS transistor Q4 is formed. The gate electrode G4 corresponds to the input terminals Ti in the switch elements (SE1 to SE4) of the first example of the configuration.

The gate electrode G5 is provided on the active region D4. In the part facing the gate electrode G5 in the active region D4, a channel of the p-type MOS transistor Q2 is formed. The gate electrode G6 is provided on the active region D5. In the part facing the gate electrode G6 in the active region D5, a channel of the n-type MOS transistor Q3 is formed. The gate electrodes G5 and G6 correspond to the terminal for receiving as input the control signal Sci or its logically inverted signal/ Sci.

In the active region D3, a region A7 on the left side of the gate electrode G4 corresponds to the source of the p-type MOS transistor Q1. This region A7 is connected via a not shown via to a metal interconnect W4. The metal interconnect W4 corresponds to the power supply line VCC.

In the active region D3, a region A8 on the right side of the gate electrode G4 corresponds to the drain of the p-type MOS transistor Q1. Further, in the active region D4, a region A9 on the left side of the gate electrode G5 corresponds to the source of the p-type MOS transistor Q2. These regions A8 and A9 are connected to each other via not shown vias and metal interconnects W5, W6, and W7.

In the active region D4, a region A10 on the right side of the gate electrode G5 corresponds to the drain of the p-type MOS transistor Q2. Further, in the active region D5, a region A11 on the right side of the gate electrode G6 corresponds to the drain of the n-type MOS transistor Q3. These regions A3 and A4 are connected to each other via not shown vias and a metal interconnect W8. The connecting point of the regions A10 and A11 corresponds to the output terminals To of the switch elements (SE1 to SE4) of the first example of the configuration.

In the active region D5, a region A12 on the left side of the gate electrode G6 corresponds to the source of the n-type MOS transistor Q3. Further, in the active region D6, a region A13 on the right side of the gate electrode G4 corresponds to the drain of the n-type MOS transistor Q1. These regions A12 and A13 are connected to each other via not shown vias and metal interconnects W9, W10 and W11.

In the active region D6, a region A14 on the left side of the gate electrode G1 corresponds to the source of the n-type MOS transistor Q4. This region A14 is connected to the metal interconnect W12 via a not shown via. The metal interconnect W3 corresponds to the ground line VSS.

Figure 16A:
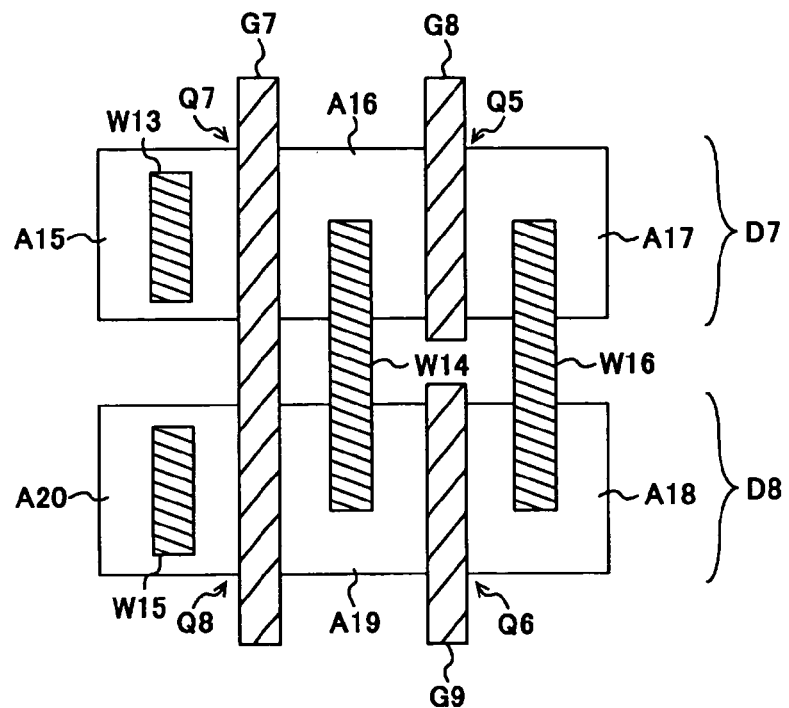
FIGS. 16A and 16B are plan views showing a structural example of a switch element of the second example of the configuration shown in FIG. 11 and FIG. 12.
Figure 16B:
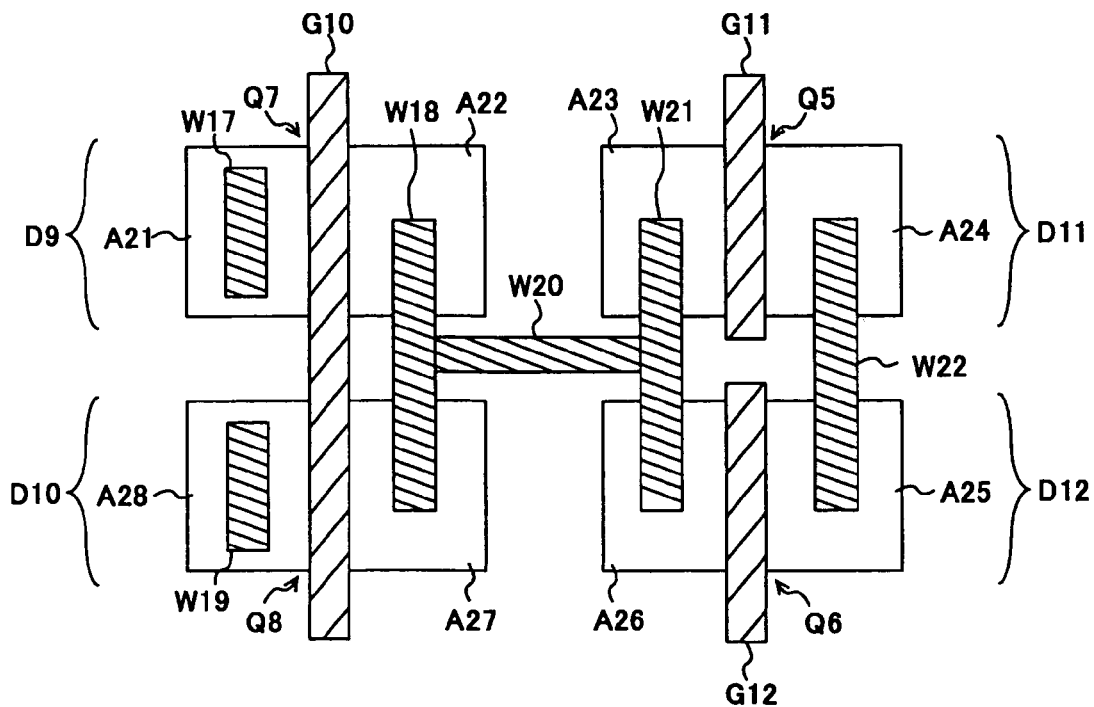

FIGS. 16A and 16B are plan views showing a structural example of the switch elements (SE1A to SE4A) of the second example of the configuration shown in FIG. 11 and FIG. 12. FIG. 16A shows an example of a case where two MOS transistors each are formed in two active regions (D7, D8), and FIG. 16B shows an example of a case where one MOS transistor each is formed in four active regions (D9 to D12).

In the structural example shown in FIG. 16A, the active regions D7 and D8 are formed in a line on the semiconductor substrate. n-type impurities are introduced into the active region D7, and p-type impurities are introduced into the active region D8. The active regions D7 and D8 have for example rectangular shapes as shown in FIG. 16A and almost the same sizes. An element isolation region is provided between active regions.

On the active regions D7 and D8, gate electrodes G7 to G9 are provided via not shown gate oxide films.

The gate electrode G7 is provided over two active regions (D7, D8). In the part facing the gate electrode G7 in the active region D7, a channel of the p-type MOS transistor Q7 is formed. Further, in the part facing the gate electrode G7 in the active region D8, a channel of the n-type MOS transistor Q8 is formed.

Note that the p-type MOS transistor Q7 and the n-type MOS transistor Q8 are transistors configuring the inverter circuit inserted in the route on the input side of the switch elements (SE1A to SE4A). The gate electrode G7 corresponds to the input terminal of this inverter circuit.

The gate electrode G8 is provided on the active region D7 on the right side of the gate electrode G7 in the figure. In the part facing the gate electrode G8 in the active region D7, a channel of the p-type MOS transistor Q5 is formed. The gate electrode G9 is provided on the active region D8 on the right side of the gate electrode G7 in the figure. In the part facing the gate electrode G9 in the active region D8, a channel of the n-type MOS transistor Q6 is formed. The gate electrodes G8 and G9 correspond to the terminal for receiving as input the control signal Sci or its logically inverted signal/ Sci.

In the active region D7, a region A15 on the left side of the gate electrode G7 corresponds to the source of the p-type MOS transistor Q7. This region A15 is connected via a not shown via to a metal interconnect W13. The metal interconnect W13 corresponds to the power supply line VCC.

In the active region D8, a region A20 on the left side of the gate electrode G7 corresponds to the source of the n-type MOS transistor Q8. This region A20 is connected via a not shown via to a metal interconnect W15. The metal interconnect W15 corresponds to the power supply line VCC.

In the active region D7, a region A16 sandwiched between the gate electrodes G7 and G8 corresponds to the drain of the p-type MOS transistor Q7 and the source of the p-type MOS transistor Q5. Further, in the active region D8, a region A19 sandwiched between the gate electrodes G7 and G9 corresponds to the drain of the n-type MOS transistor Q8 and the source of the n-type MOS transistor Q6. These regions A16 and A19 are connected to each other via not shown vias and a metal interconnect W14. The connecting point of the regions A16 and A19 corresponds to the output terminal of the above inverter circuit and, at the same time, corresponds to terminals on the side of inputting signals in the switch elements (SE1A to SE4A) of the second example of the configuration.

In the active region D7, a region A17 on the right side of the gate electrode G8 corresponds to the drain of the p-type MOS transistor Q5. Further, in the active region D8, a region A18 on the right side of the gate electrode G9 corresponds to the drain of the n-type MOS transistor Q6. These regions A17 and A18 are connected to each other via not shown vias and a metal interconnect W16. The connecting point of the regions A17 and A18 corresponds to terminals on the side of outputting signals in the switch elements (SE1A to SE4A) of the second example of the configuration.

In the structural example shown in FIG. 16B, four active regions D9, D10, D11, and D12 are formed in a matrix on the semiconductor substrate. In the example of FIG. 16B, the active region D11 is formed on the right side of the active region D9, the active region D10 is formed on the lower side of the active region D9, and the active region D12 is formed on the lower side of the active region D11 and the right side of the active region D10. n-type impurities are introduced into the active regions D9 and D11, and p-type impurities are introduced into the active regions D10 and D12. The active regions D9 to D12 have for example rectangular shapes as shown in FIG. 16B and almost the same sizes. Element isolation regions are provided among active regions.

On the active regions D9 to D12, gate electrodes G10 to G12 are provided via not shown gate oxide films.

The gate electrode G10 is provided over the active regions D9 and D10. In the part facing the gate electrode G10 in the active region D9, a channel of the p-type MOS transistor Q7 is formed. Further, in the part facing the gate electrode G10 in the active region D10, a channel of the n-type MOS transistor Q8 is formed. The gate electrode G10 corresponds to the input terminal of the inverter circuit configured by the p-type MOS transistor Q7 and the n-type MOS transistor Q8.

The gate electrode G11 is provided on the active region D11. In the part facing the gate electrode G11 in the active region D11, a channel of the p-type MOS transistor Q5 is formed. The gate electrode G12 is provided on the active region D12. In the part facing the gate electrode G12 in the active region D12, a channel of the n-type MOS transistor Q6 is formed. The gate electrodes G11 and G12 correspond to the terminal for receiving as input the control signal Sci or its logically inverted signal/ Sci.

In the active region D9, a region A21 on the left side of the gate electrode G10 corresponds to the source of the p-type MOS transistor Q7. This region A21 is connected to a metal interconnect W17 via a not shown via. The metal interconnect W17 corresponds to the power supply line VCC.

In the active region D10, a region A28 on the left side of the gate electrode G10 corresponds to the source of the n-type MOS transistor Q8. This region A28 is connected to a metal interconnect W19 via a not shown via. The metal interconnect W19 corresponds to the ground line VSS.

In the active region D9, a region A22 on the right side of the gate electrode G10 corresponds to the drain of the p-type MOS transistor Q7. Further, in the active region D10, a region A27 on the right side of the gate electrode G10 corresponds to the drain of the n-type MOS transistor Q8. These regions A22 and A27 are connected to each other via not shown vias and a metal interconnect W18. The connecting point of the regions A22 and A27 corresponds to the output terminal of the inverter circuit configured by the p-type MOS transistor Q7 and the n-type MOS transistor Q8.

In the active region D11, a region A23 on the left side of the gate electrode G11 corresponds to the source of the p-type MOS transistor Q5. Further, in the active region D12, a region A26 on the left side of the gate electrode G12 corresponds to the source of the n-type MOS transistor Q6. These regions A23 and A26 are connected to each other via not shown vias and a metal interconnect W21. The connecting point of the regions A23 and A26 corresponds to terminals on the side for receiving as input signals in the switch elements (SE1A to SE4A) of the second example of the configuration.

The metal interconnects W18 and W21 are connected via a metal interconnect W20. Due to this, output terminals of the inverter circuits (Q7, Q8) and input terminals of the switch elements (SE1A to SE4A) are connected.

In the active region D11, a region A24 on the right side of the gate electrode G11 corresponds to the drain of the p-type MOS transistor Q5. Further, in the active region D12, a region A25 on the right side of the gate electrode G12 corresponds to the drain of the n-type MOS transistor Q6. These regions A24 and A25 are connected to each other via not shown vias and a metal interconnect W22. The connecting point of the regions A24 and A25 corresponds to terminals on the side for outputting signals in switch elements (SE1A to SE4A) of the second example of the configuration.

In switch elements (SE1A to SE4A) of the second example of the configuration shown in FIG. 16A, in order to connect the regions A16 and A19 sandwiched between the gate electrode G7 and the gate electrodes G8 and G9, a metal interconnect W14 and vias are provided. On the other hand, in the switch elements (SE1A to SE4A) of the first example of the configuration shown in FIG. 15A, it is not necessary to connect the regions A2 and A5 sandwiched between the gate electrode G1 and gate electrodes G2 and G3, therefore the metal interconnect and vias as shown in FIG. 16A are unnecessary. Accordingly, the switch elements (SE1 to SE4) of the first example of the configuration can be reduced in area compared with the circuit obtained by adding inverter circuits (Q7, Q8) to the switch elements (SE1A to SE4A) of the second example of the configuration.

Note that, in the case where transistors are formed in different active regions, as seen also from the comparison of FIG. 15B and FIG. 16B, the areas of the two are not so different. Further, when only the switch elements (SE1A to SE4A) of the second example of the configuration are used by deleting the inverter circuits (Q7, Q8), the switch elements (SE1A to SE4A) of the second example of the configuration can be reduced in area compared with the switch elements (SE1 to SE4) of the first example of the configuration. In this case, however, a signal delay occurs by the resistance components of the transmission gate circuits (Q5, Q6), therefore the operating speed of the circuit becomes slower in comparison with the case where switch elements (SE1 to SE4) of the first example of the configuration are used.

The above concludes the explanation of the switch elements included in the switch circuits SWAki and SWBki of the module selection part 50.

The control part 1 generates control signals Sc1 to Sc8 for controlling the operation of switch circuits of the module selection part 50 in accordance with the signal stored in the storage part 3 or the signal input from the signal input part 2.

The control part 1 outputs the following control signals Sc1 to Sc8 in accordance with the value of the integer n when the signal stored in the storage part 3 or the signal input from the signal input part 2 instructs to disconnect modules in the n-th column (n=1, ,9) from all input/output parts.

$2 \leq n \leq 8$

In this case, the control part 1 sets the control signals Sc1 to Sc(n−1) at the value "1" and sets the control signals Scn to Sc8 at the value "0".

When the control signal Scn becomes the value "0", the switch circuits SWA1n, SWA2n, SWA3n, and SWA4n turn off, while when the control signal Sc(n−1) becomes the value "1", the switch circuits SWB1(n−1), SWB2(n−1), SWB3(n−1), and SWB4(n−1) turn off. Due to this, the four modules belonging to the n-th column are disconnected from all input/output parts.

Further, when the control signals Sc1 to Sc(n−1) become the value "1", the switch circuits SWA1p, SWA2p, SWA3p, and SWA4p turn on and the switch circuits SWB1p, SWB2p, SWB3p, and SWB4b turn off (p indicates an integer from 1 to (n−1)). Due to this, the four input/output parts P1p, P2p, P3p, and P4p belonging to the p-th column are connected to the four modules M1p, M2p, M3p, and M4p belonging to the p-th column. That is, the first to the (n−1)th columns of input/output parts are connected to the first column to the (n−1)th column of modules.

On the other hand, when the control signals Scn to Sc8 become the value "1", the switch circuits SWA1q, SWQ2q, SWA3q, and SWA4q turn off and the switch circuits SWB1q, SWB2q, SWB3q, and SWB4q turn on (q indicates the integer from n to 8). Due to this, the four input/output parts P1q, P2q, P3q, and P4q belonging to the q-th column are connected to the four modules M1 (q+1), M2 (q+1), M3(q+1), and M4(q+1) belonging to the q-th column. That is, the n-th column to the eighth column of input/output parts are connected to the (n+1)th to ninth columns of modules.

n=1

In this case, the control part 1 sets all of the control signals Sc1 to Sc8 at the value "0". Due to this, all of the switch circuits SWA11, SWA21, SWA31, and SWA41 turn off, therefore the modules belonging to the first column are disconnected from all input/output parts. Further, when "i" is an integer from 1 to 8, the switch circuits SWA1i, SWA2i, SWA3i, and SWA4i turn off, and the switch circuits SWB1i, SWB2i, SWB3i, and SWB4i turn on. Due to this, the four input/output parts P1i, P2i, P3i, and P4i belonging to the i-th column are connected to the four modules M1 (i+1), M2 (i+1), M3 (i+1), and M4 (i+1) belonging to the (i+1)th column. Namely, the first column to the eighth column of the input/output parts are connected to the second column to the ninth column of modules.

n=9

In this case, the control part 1 sets all of the control signals Sc1 to Sc8 at the value "1". Due to this, all of the switch circuits SWB18, SWB28, SWB38, and SWB48 turn off, therefore the ninth column of modules are disconnected from all input/output parts. Further, when "i" is an integer from 1 to 8, the switch circuits SWA1i, SWA2i, SWA3i, and SWA4i turn on and the switch circuits SWB1i, SWB2i, SWB3i, and SWB4i turn off. For this reason, the four input/output parts P1i, P2i, P3i, and P4i belonging to the i-th column are connected to the four modules M1i, M2i, M3i, and M4i belonging to the i-th column. Namely, the first column to the eighth column of the input/output parts are connected to the first column to the eighth column of modules.

Further, the control part 1 generates control signals Sc1 to Sc8 in accordance with the signal input from the signal input part 2 when the signal stored in the storage part 3 has a predetermined initial value, while generates control signals Sc1 to sc8 in accordance with the signal stored in the storage part 3 when the signal stored in the storage part 3 has a value different from the above predetermined initial value. Due to this, in for example the initial state where no signal has been written in the storage part 3 (where the module is inspected etc.), control signals Sc1 to Sc8 can be generated in accordance with the signal input to the signal input part 2 from the outside of the semiconductor integrated circuit, therefore the connections between input/output parts and modules can be freely controlled. Further, after writing signals in the storage part 3, the control signals Sc1 to Sc8 can be generated in accordance with the written signal, therefore the connections between input/output parts and modules can be fixed to the desired state without inputting any signal from the outside.

Figure 17:
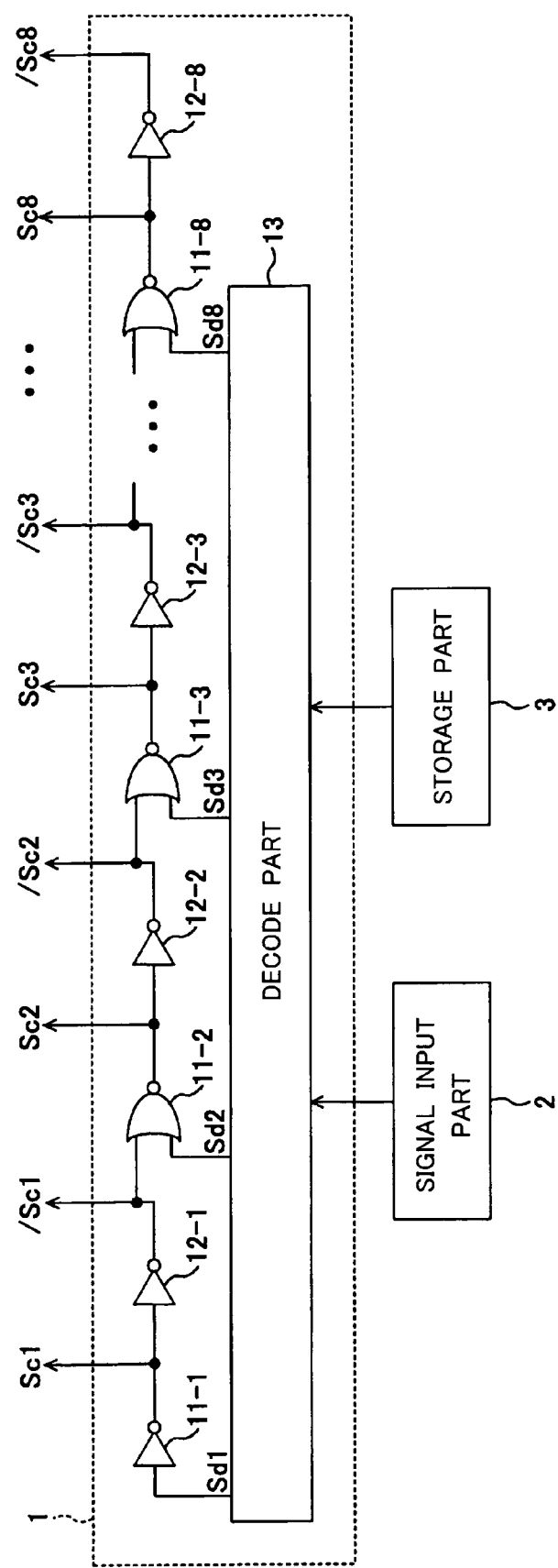
FIG. 17 is a diagram showing an example of the configuration of a control part.

FIG. 17 is a diagram showing an example of the configuration of the control part 1. The control part 1, for example as shown in FIG. 17, has a decode part 13, NOR circuits 11-2 to 11-8, and inverter circuits 11-1 and 12-1 to 12-8.

The decode part 13 decodes the signal stored in the storage part 3 or the signal input from the input part 2 and outputs decoding results thereof as instruction signals Sd1 to Sd8. Namely, the decode part 13 generates the following instruction signals Sd1 to Sd8 in accordance with the value of the integer n when the signal stored in the storage part 3 or the signal input from the signal input part 2 instruct to disconnect the n-th column of modules from all input/output parts. When "n" is an integer from 1 to 8, only the instruction signal Sdn is set at the value "1". The other instruction signals are set at the value "0". When "n" is the integer 9, all of the instruction signals Sd1 to Sd8 are set at the value "0".

The instruction signals Sdi (i=1, , 8) output in the decode part 13 are-signals for instructing whether or not the i-th column of the modules are to be disconnected from all input/output parts. When the value of the instruction signal Sdi is "1", the i-th column of the modules are disconnected from all input/output parts by the module selection part 50.

When the signal stored in the storage part 3 has the above predetermined initial value, the decode part 13 generates instruction signals Sd1 to Sd8 in accordance with the signal input from the signal input part 2. When the signal stored in the storage part 3 has a value different from the above predetermined initial value, the decode part 13 generates instruction signals Sd1 to Sd32 in accordance with the signal stored in the storage part 3.

A NOR circuit 11-j (j indicates an integer from 2 to 8) computes an inverted OR logic of a control signal/Sc (j−1) output from an inverter circuit 12-(j−1) and an instruction signal Sdj and outputs the computation result as a control signal Scj.

The inverter circuit 12-j logic inverts the control signal Scj and outputs the same as a control signal/Scj.

The inverter circuit 11-1 logic inverts the instruction signal Sd1 and outputs the same as the control signal Sc1. The inverter circuit 12-1 logic inverts the control signal Sc1 and outputs the same as the control signal/Sc1.

When the instruction signal Sdj (j=2, , 8) of the decode part 13 becomes "1", the NOR circuit 11-j receiving as input this instruction signal Sdj outputs the control signal Scj having the value "0". When "j" is smaller than 8, the control signal/Scj of the value "1" obtained by logically inverting the control signal Scj is input to the NOR circuit 11-(j+1), therefore the NOR circuit 11-(j+1) also outputs the control signal Sc(j+1) having the value "0". In this way, all of the control signals Sc(j+1) to Sc8 output from the NOR circuits 11-(j+1) to 11-8 in the latter stage than the NOR circuit 11-j become the value "0".

When the instruction signal Sd1 of the decode part 13 becomes the value "1", the control signal Sc1 obtained by logically inverting this instruction signal Sd1 becomes the value "0", the control signal/Sc1 obtained by further logically inverting this is input to the NOR Circuit 11-2, and the output signal thereof (control signal Sc2) becomes the value "0". Due to this, all of the values of the control signals Sc2 to Sc8 output from the NOR circuits 11-2 to 11-8 become the value "0". Namely, when the instruction signal Sd1 has the value "1", all of the control signals Sc1 to Sc8 become the value "0".

On the other hand, when all of the instruction signals Sd1 to Sd8 of the decode part 13 become the value "0", all of the input signals of the inverter circuit 11-1 and the NOR circuits 11-2 to 11-8 become the value "0", therefore all of the control signals Sc1 to Sc8 become the value "1".

Accordingly, in the case where the n-th column of modules are disconnected from all input/output parts, when "n" is an integer from 2 to 8, only the instruction signal Sdn is set at the value "1" by the decode part 13, therefore the control signals Sc1 to Sc(n−1) become the value "1", and the control signals Scn to Sc8 become the value "0". When "n" is the integer 1, the instruction signal Sd1 is set at the value "1" by the decode part 13, therefore all of control signals Sc1 to Sc8 become the value "0". When "n" is the integer 8, all of the instruction signals Sd1 to Sd8 are set at the value "0" by the decode part 13, therefore all of control signals Sc1 to Sc8 become the value "1".

The storage part 3 stores a signal for designating one column to be disconnected from all input/output parts among the nine columns of modules. Further, the storage part 3 stores a signal having a predetermined initial value in the initial state where the writing is not carried out. The storage part 3 can be configured by for example a fuse element or nonvolatile memory.

The signal input part 2 is a circuit for receiving as input a signal designating one column of modules to be disconnected from all input/output parts and is used for receiving as input a signal from an external device to the control part 1 in for example the case where the semiconductor integrated circuit is inspected.

The power supply switch circuits PS1 to PS9 turn on or off the power of each column of modules in accordance with the signal output from the control part 1. Namely, they turn off the power of the modules belonging to the column disconnected from all input/output parts.

The power supply switch circuits Psi (i=1, , 8) are inserted in a common power supply line of the modules (M1i, M2i, M3i, M4i) belonging to the i-th column and turn on when the instruction signal Sdi has the value "0", while turn off when the instruction signal Sdi has the value "1". The instruction signal Sdi becomes the value "1" when the i-th column of modules are disconnected from all input/output parts, therefore, in this case, the supply of power to the i-th column of modules is shut off.

The power supply switch circuit PS9 is inserted in the common power supply line of the modules (M19, M29, M39, M49) belonging to the ninth column, turns on when the control signal Sc8 has the value "0", and while turns off when the control signal Sc8 has the value "1". The control signal Sc8 becomes the value "1" when the module M9 is disconnected from all input/output parts, therefore, in this case, the supply of power to the module M9 is shut off.

Figure 18A:
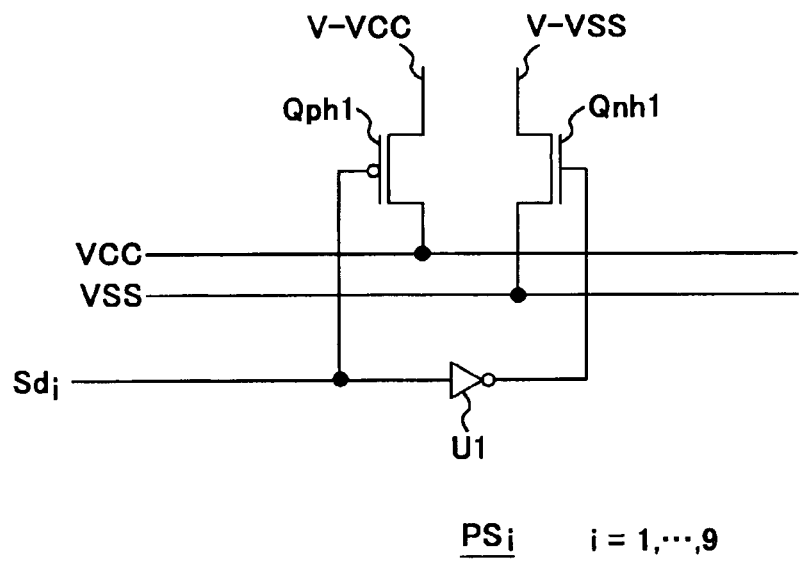
FIGS. 18A and 18B are diagram showing an example of the configuration of a power supply switch circuit.

FIG. 18A is a diagram showing an example of the configuration of the power supply switch circuit Psi (i=1, , 8). The power supply switch circuit Psi, for example as shown in FIG. 16A, has an n-type MOS transistor Qnh1, p-type MOS transistor Qph1, and inverter circuit U1.

The p-type MOS transistor Qph1 is connected at its source to the power supply line VCC, connected at its drain to a virtual power supply line V-VCC of the i-th column of modules, and receives as input the instruction signal Sd1 at its gate. As the p-type MOS transistor Qph1, use can also be made of a p-type MOS transistor having small leakage current and high threshold value type in comparison with the usual p-type MOS transistor in the semiconductor integrated circuit.

The n-type MOS transistor Qnh1 is connected at its source to the ground line VSS and connected in its drain to a virtual ground line V-VSS of the i-th column of modules. For the n-type MOS transistor Qnh1, use can be also made of a high threshold value type n-type MOS transistor having a high leakage current in comparison with the usual n-type MOS transistor used in the semiconductor integrated circuit.

The inverter circuit U1 logic inverts the signal input to the gate of the p-type MOS transistor Qph1 and inputs the same to the gate of the n-type MOS transistor Qnh1.

According to the power supply switch circuit Psi shown in FIG. 18A, when the instruction signal Sdi has the value "0" (when the modules belonging to the i-th column are connected to any input/output parts), a signal of the low level is input to the gate of the p-type MOS transistor Qph1, a signal of the high level is input to the gate of the n-type MOS transistor Qnh1, and both of these transistors turn on. For this reason, power is supplied to the modules belonging to the i-th column from the power supply line VCC and the ground line VSS. On the other hand, when the instruction signal Sdi has the value "1" (when modules belonging to the i-th column are disconnected from all input/output parts), both of the p-type MOS transistor Qph1 and the n-type MOS transistor Qnh1 turn off, and the supply of power to the modules belonging to the i-th column is shut off.

Figure 18B:
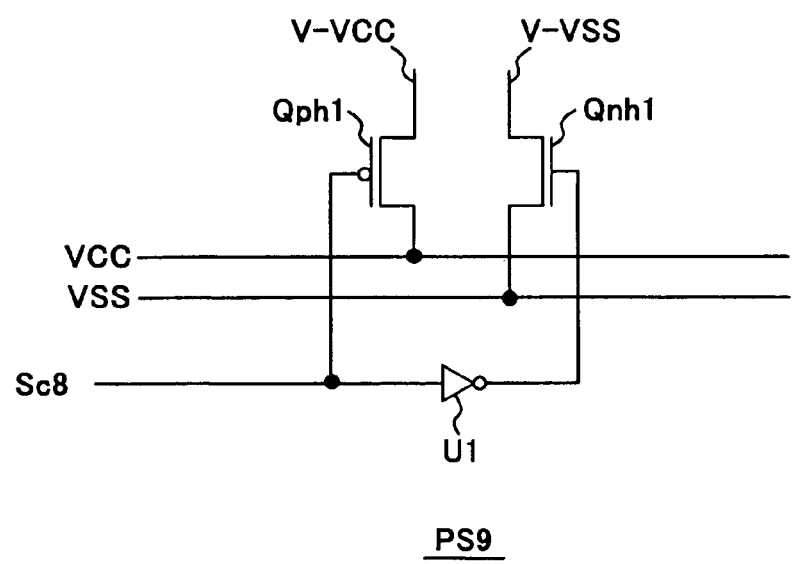

FIG. 18B is a diagram showing an example of the configuration of the power supply switch circuit PS9. The power supply switch circuit PS9 has the same configuration as that of the power supply switch circuit PSi (i=1, , 8) shown in FIG. 18A. The power supply switch circuit PS8 is different from the power supply switch circuit PSi shown in FIG. 18A in the point that the control signal Sc8 is input in place of the instruction signal Sdi. The control signal Sc8 becomes the value "0" when any of the instruction signals Sd1 to Sd8 becomes the value "1". Namely, it becomes the value "0" in the case where modules belonging to any column among the first column to the eighth column are disconnected from all input/output parts and modules belonging to the ninth column are connected to input/output parts belonging to the eighth column in place of the former. In this case, a signal of the low level is input to the gate of the p-type MOS transistor Qph1, a signal of the high level is input to the gate of the n-type MOS transistor Qnh1, and both of these transistors turn on, therefore power is supplied to modules belonging to the ninth column from the power supply line VCC and the ground line VSS. On the other hand, the control signal Sc8 becomes the value "1" when all of the instruction signals Sd1 to Sd8 become the value "0". Namely, it becomes the value "0" when the modules belonging to the first column to the eighth column are connected to the input/output parts, and the modules belonging to the ninth column are disconnected from all input/output parts as a redundant column. In this case, both of the p-type MOS transistor Qph1 and the n-type MOS transistor Qnh1 turn off, and the supply of power to modules belonging to the ninth column is shut off.

Here, a defect repair operation in a semiconductor integrated circuit according to the present embodiment having the above configuration will be explained with reference to FIG. 19 and FIG. 20.

Figure 19:
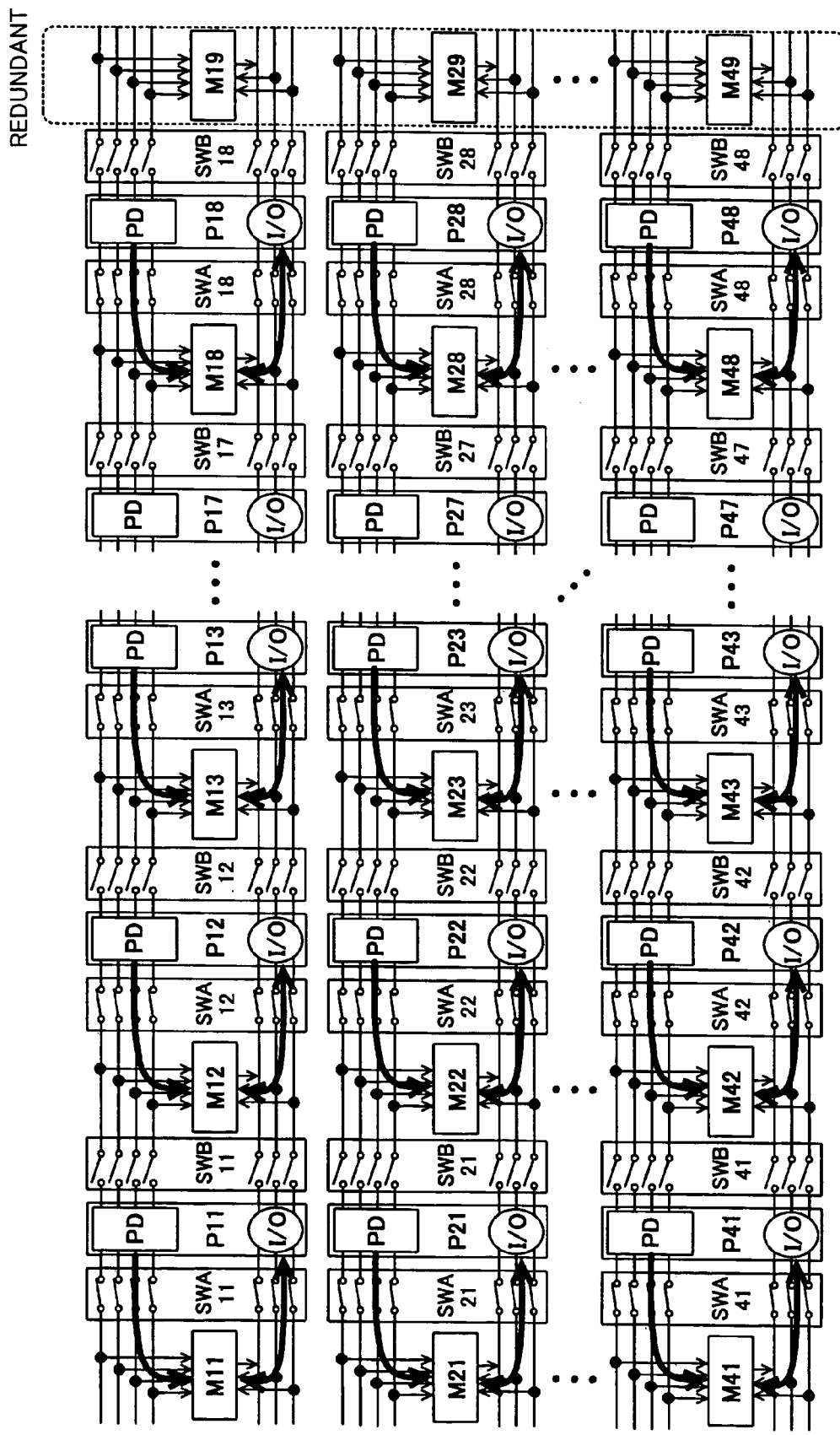
FIG. 19 shows a default connection state of the semiconductor integrated circuit shown in FIG. 6.

FIG. 19 shows the default connection state before inspection for defects. In the example shown in FIG. 19, the first column to the eighth column of input/output parts are connected to the first column to the eighth column of modules, and the ninth column of modules becomes the redundant column.

Figure 20:
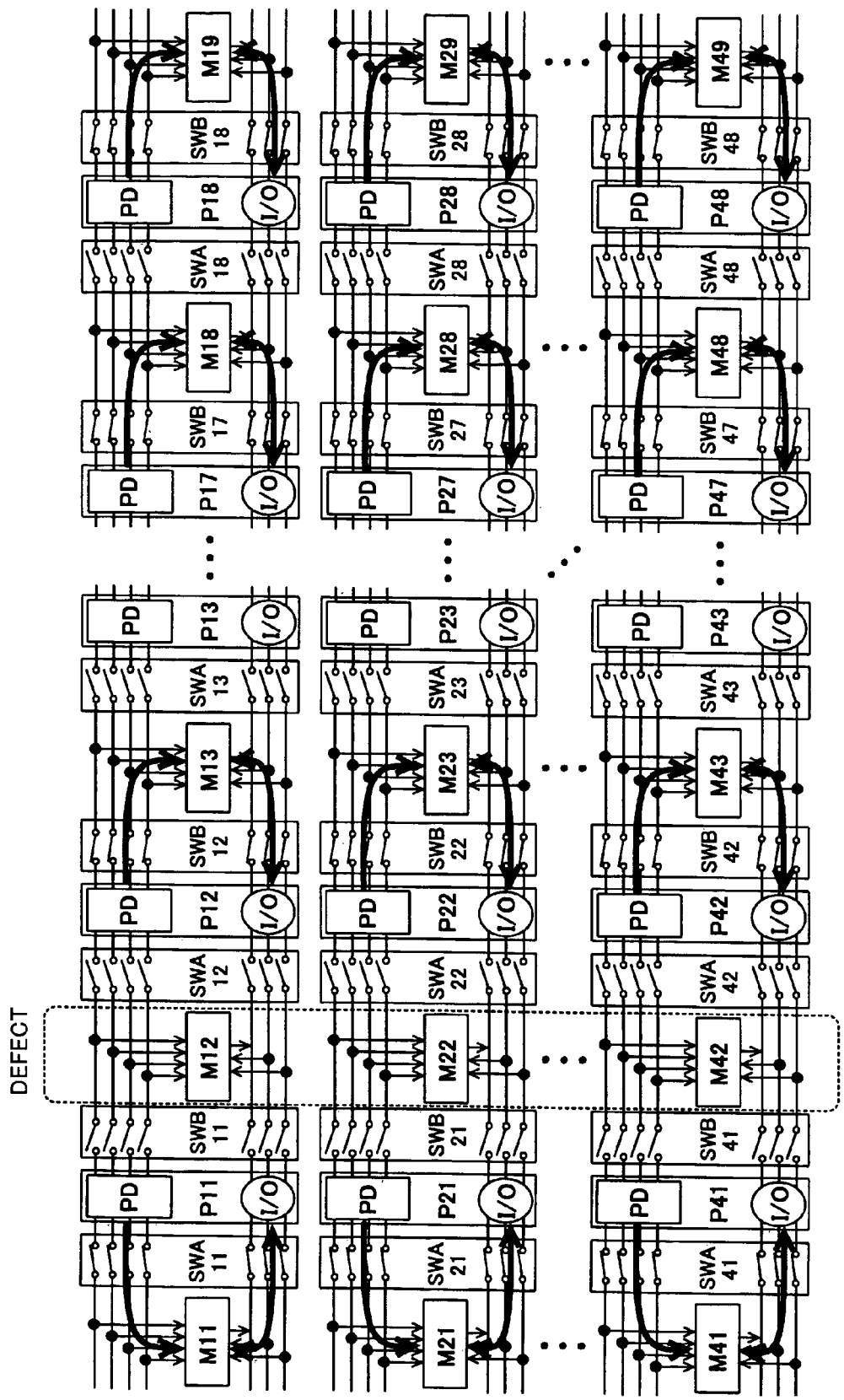
FIG. 20 is a diagram showing an example of repair of a defect in the semiconductor integrated circuit shown in FIG. 6.

FIG. 20 shows the connection state in the case where the module M22 in the second row and second column has a defect. In this case, the second column of modules (M12, M22, M32, M42) including the module M22 and the second column of input/output parts are disconnected by the control part 1. Further, the second column to the eighth column of input/output parts are connected to the third column to the ninth column of modules. Namely, the destination of each input/output part shifts toward the redundant column (ninth column). Due to this, the four rows and eight columns of input/output parts are connected with the four rows and eight columns of modules excluding the second column including the defect in a one-to-one correspondence. Then, the function setting data held in the data holding part PD of each input/output part is input to the destination module, and the logical function of each module is set in accordance with this function setting data.

As explained above, according to the semiconductor integrated circuit according to the present embodiment, the supply of power to modules belonging to the column disconnected from the input/output parts is shut off, therefore the useless consumption of power in modules not contributing to the operation of the circuit can be prevented. When a fault resulting in a large current flowing in the power supply line occurs in a module, this is shut off and the influence upon the power supply system or other circuits can be prevented, therefore the drop in the yield due to a fault of a module can be effectively suppressed.

Further, the power supplies of all modules belonging to the same column are commonly controlled, therefore the number of power supply switch circuits can be decreased in comparison with the case where the power supplies of the individual modules are controlled.

Further, the connection states of all modules belonging to the same column are commonly controlled by the same control signal supplied from the control part 1. Due to this, the number of control signals can be greatly decreased in comparison with the case where the connection states with the input/output parts are independently controlled for individual modules, therefore the circuit configuration of the control part 1 can be simplified.

In addition, when inspecting for faults, the presence of any fault may be inspected for each column, therefore the inspection time can be shortened in comparison with the case where individual modules are inspected.

Further, when writing information of a fault module into a storage element such as a fuse configuring the storage part 3, the information of the presence of a fault of the module may be written for each column, therefore the amount of information becomes smaller, and the time required for the write processing can be shortened.

Fourth Embodiment

Next, an explanation will be given of a fourth embodiment of the present invention. The present embodiment relates to the method of inspection of modules.

Figure 21:
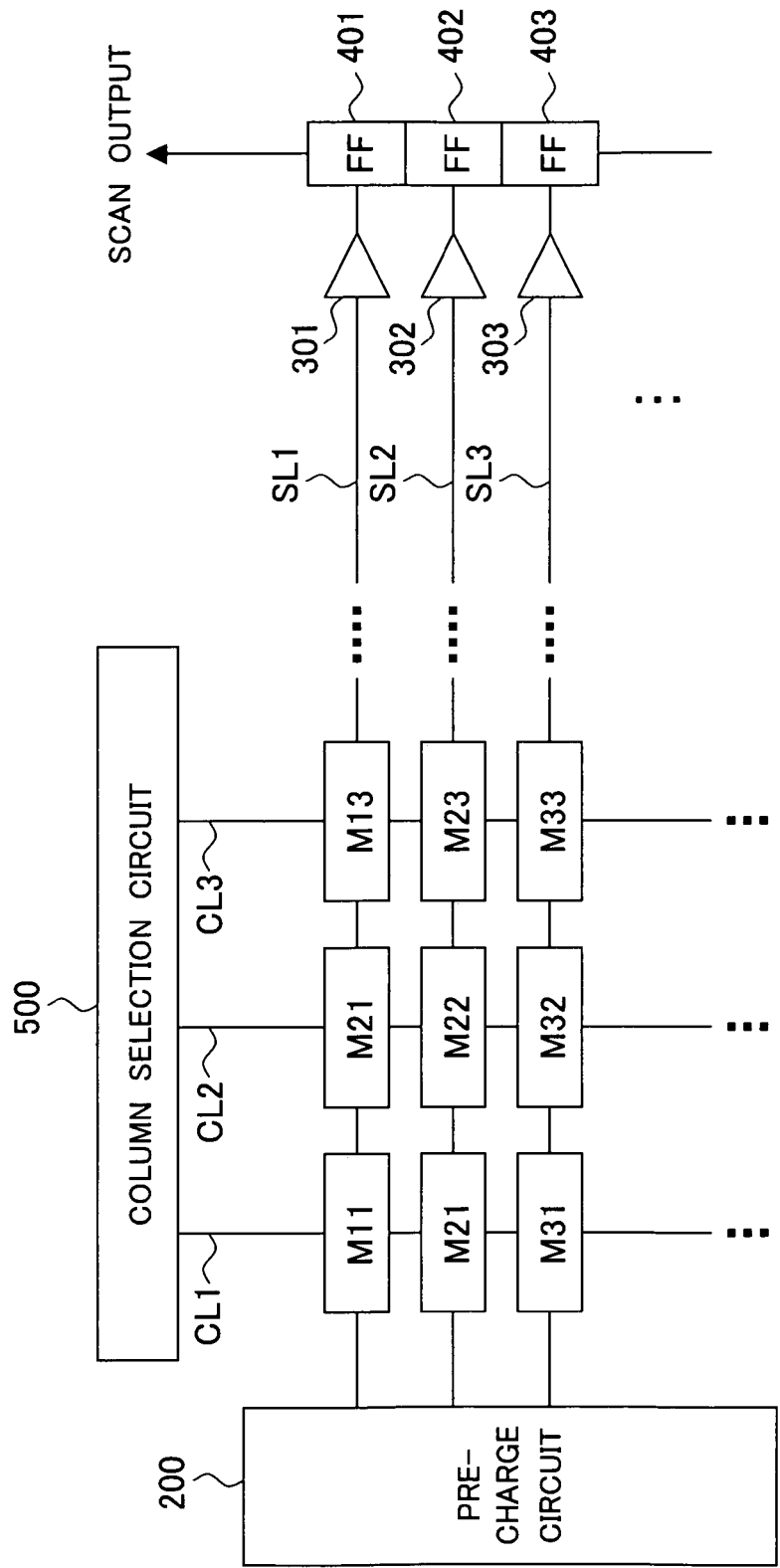
FIG. 21 is a diagram showing an example of circuits involved in inspection of the modules.

FIG. 21 is a diagram showing an example of the circuits involved in the inspection of modules. The same notations shown in FIG. 1 and FIG. 15 show the same components.

The semiconductor integrated circuit according to the present embodiment has, as circuits involved in inspection of modules, a column selection circuit 500, precharge circuit 200, sense amplifiers 301, 302, 303, and scan flip-flops 401, 402, 403.

The column selection circuit 500 sequentially sets column selection lines CL1, CL2, CL3, at the high level in the test mode for inspection of the circuits. Note that the column selection lines CL1, CL2, CL3, are commonly connected to modules belonging to the first column, second column, third column. When for example the column selection line CLi of the i-th column is set at the high level by the column selection circuit 500, the transistors Qn14 turn on in modules connected to this column selection line CLi. As a result, signals indicating the inspection results of the i-th column of modules are output to the inspection output lines SL1, SL2, SL3.

The precharge circuit 200 precharges the inspection output lines SL1, SL2 SL3, to the power supply voltage VDD before the column selection line is set at the high level in the column selection circuit 500. Note that the inspection output lines SL1, SL2 SL3, are commonly connected to modules belonging to the first row, second row, third row.

The sense amplifiers 301, 302, 303, amplify signals of the inspection results of modules output to the inspection output lines SL1, SL2, SL3.

The scan flip-flops 401, 402, 403, latch the signals of the inspection results amplified in the sense amplifiers 301, 302, 303, and convert them to serial data for output.

Figure 22:
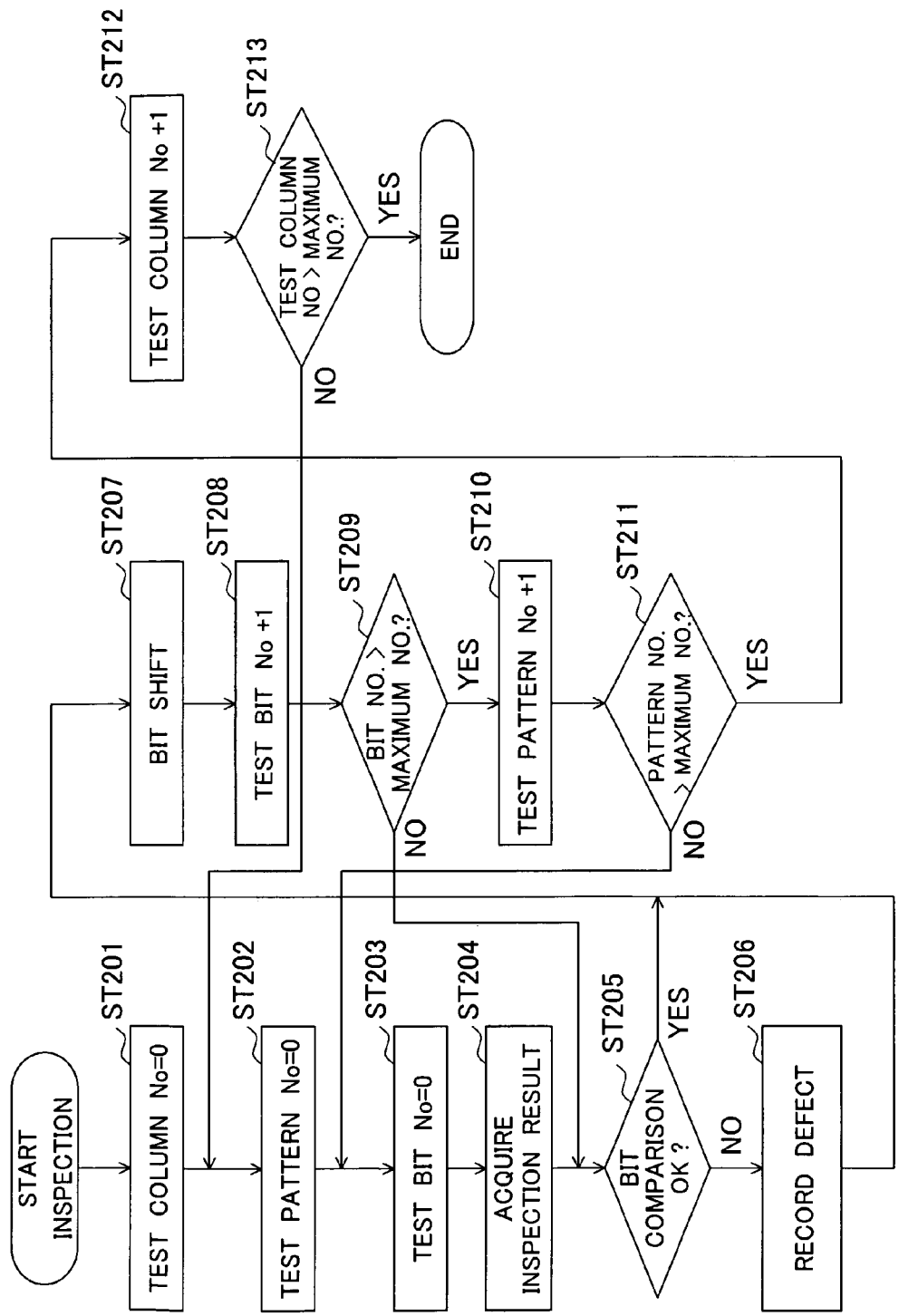
FIG. 22 is a flow chart illustrating an example of inspection processing by the circuit shown in FIG. 21.

FIG. 22 is a flow chart illustrating an example of the inspection processing by the circuit shown in FIG. 21.

First, at the time of the start of inspection, the number indicating the column to be tested (hereinafter called the "test column number"), the number indicating the pattern of test signals (hereinafter called the "test pattern number"), and the number indicating the row to be tested (hereinafter called the "test bit number") are initialized to "0" (steps ST201 to ST203).

Then, test signals indicated by the test pattern number are supplied from a not shown inspection system to the modules. For example in the case of a module shown in FIG. 7, test signals are supplied from the not shown inspection system to the input nodes Ta and Tb. Further, the terminal Tmod of each module is set at the high level and, at the same time, a column selection line of the column indicated by the test column number is set at the high level by the column selection circuit 500. Further, by the signal input from the signal input part 2 to the control part 1, all of the modules of the column indicated by the test column number are disconnected from all input/output parts. When the terminal Tmod becomes the high level, the test signal of the inspection system is input to each module. Then, from each module, the signal of the inspection result in accordance with this test signal is output. At this time, in each module of the column for which the column selection line is set at the high level, the transistor Qn14 becomes the ON state. The signal of the output terminal Y1b is output via the transistor Qn14 to the corresponding one of inspection output lines SL1, SL2, SL3. The signals of the inspection output lines SL1, SL2, SL3, are amplified at the sense amplifiers 301, 302, 303, , and latched by the scan flip-flops 401, 402, 403, (step ST204).

Among the data latched at scan flip-flops 401, 402, 403, , the data of the row indicated by the test bit number is compared with the expected value (step ST205), while when it is different from the expected value, the information of the column of the modules outputting this data is recorded as the information of a module having the defect (step ST206). When it coincides with the expected value, the data of scan flip-flops 401, 402, 403, are shifted 1 bit (step ST207), and "1" is added to the test bit number (step ST208). At this time, when the test bit number does not reach the predetermined maximum value (that is, the number indicating the last row), the processing of steps ST205 to ST208 mentioned above is repeated for the data of the next row corresponding to the test bit number to which "1" is added.

When it is judged that the test bit number has reached the predetermined maximum value (that is, the number indicating the last row) (step ST209), "1" is added to the test pattern number (step ST210). At this time, when the test pattern number has not reached the predetermined maximum value (that is, the number indicating the last pattern), the next test pattern corresponding to the test pattern number to which "1" is added is generated in the not shown inspection system, and the processing of steps ST203 to ST210 mentioned above is repeated.

When it is judged that the test pattern number has reached the predetermined maximum value (that is, the number indicating the last pattern) (step ST211), "1" is added to the test pattern number. At this time, when the test column number does not reach the predetermined maximum value (that is, the number indicating the last column), the next column corresponding to the test column number to which "1" is added becomes the inspection target. Namely, the column selection signal of the next column is set at the high level by the column selection circuit 500, and the processing of steps ST202 to ST212 mentioned above is repeated.

Where it is judged that the test column number reaches the predetermined maximum value (that is, the number indicating the last column) (step ST213), the inspection of all modules ends.

While some embodiments of the present invention were explained above, the present invention is not limited to only the above embodiments. It includes for example a variety of variations as mentioned next.

The module selection part in the present invention may connect signal input terminals of modules disconnected from all input/output parts to the interconnects at a predetermined potential. In the switch elements shown in FIGS. 9, 11, and 13, the output terminals To become the high impedance state at the time of the OFF state. For this reason, when modules are disconnected from all input/output parts, the signal input terminals of those modules become the high impedance state, and the potential becomes unstable. When power is supplied to a module in this state, the circuit inside the module operates in accordance with the unstable potential of the signal input terminal, therefore useless power is consumed due to penetration current etc. Therefore, if the signal input terminals of modules disconnected from all input/output parts are connected to interconnects at a predetermined potential, the potentials of signal input terminals can be stabilized, therefore the increase of the power consumption due to the penetration current etc. can be prevented.

Figure 23:
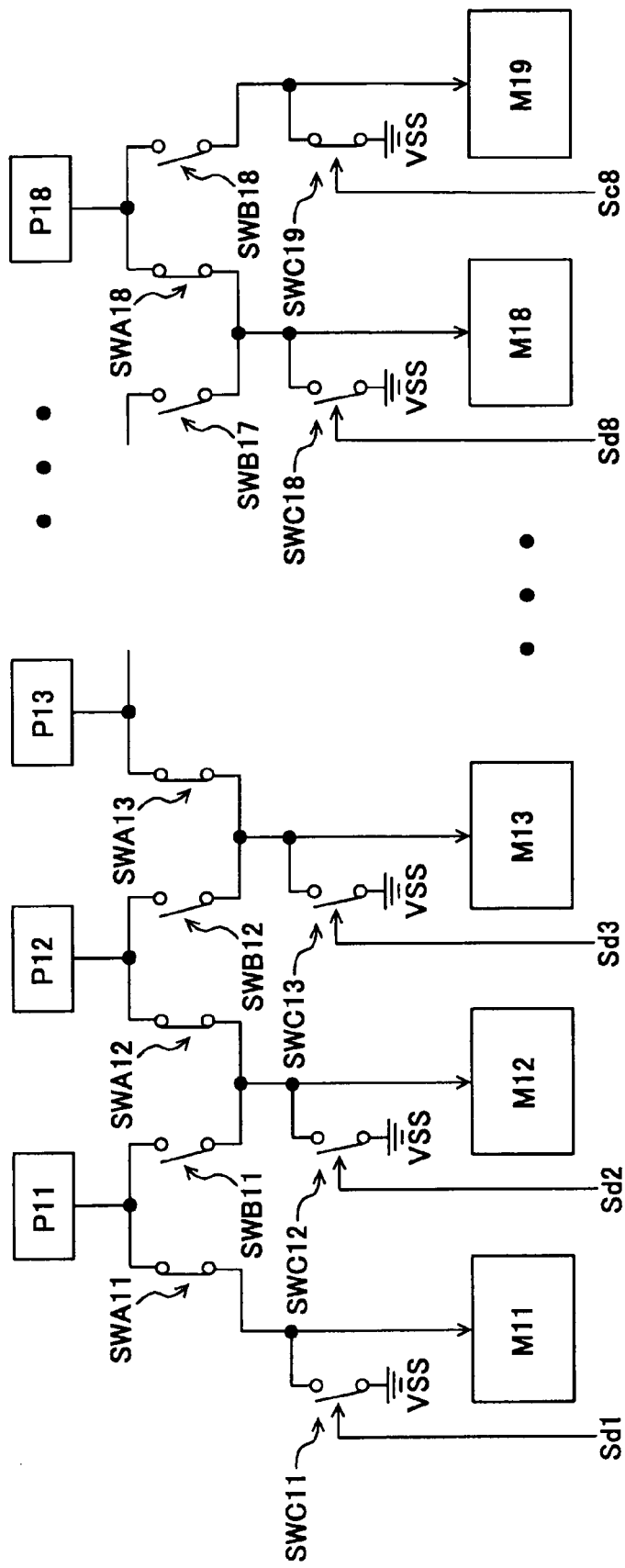
FIG. 23 is a diagram showing an example of the configuration of a module selection part provided with a switch circuit for connecting a signal input terminal to an interconnect at a predetermined potential.

FIG. 23 is a diagram showing an example of the configuration of the module selection part 50 in which a circuit for stabilizing the potential of the signal input terminal of each module is added in the semiconductor integrated circuit shown in FIG. 5. In FIG. 23, only the part concerning the modules of the first row is shown, but the same is true also for other rows. Switch elements SWCkn (k=1, , 4; n=1, , 9) are connected between the signal input terminals of the modules kn and the ground line VSS, while when the modules Mkn are disconnected from all input/output parts, the signal input terminals thereof are connected to the ground line VSS. Switch elements SWCki (i=1, , 32) turn on when the instruction signal Sdi has the value "1", that is, when the modules Mi are disconnected from all input/output parts, and turn off in cases other than this. The switch circuit SWCk9 turns on when the control signal Sc8 is "1", that is, when the ninth column of modules are disconnected from all input/output parts, and turns off in cases other than this.

In the above embodiments, the modules and input/output parts were arranged in a matrix, but the present invention is not limited to this. For example, the number of rows in the above matrix may be set to 1. In this case, the modules and input/output parts may be arranged along one straight line, may be arranged along any other line such as a curve or meandering line, or may be arranged in a zigzag state.

All of the above semiconductor integrated circuits may be formed on the same semiconductor chip or formed on a plurality of semiconductor chips by division by using for example the system-in-package (SIP) technology.

In the above embodiments, the CMOS type semiconductor integrated circuit was mainly explained as an example, but the present invention is not limited to this. The present invention can be applied to an integrated circuit configured by various circuit elements such as bipolar transistors.

The specific numerical values shown in the above embodiments (number of modules, number of input/output parts, number of module blocks, row number, column number, etc.) are just examples and can be appropriately modified to any numerical values.

It should be understood by those skilled in the art that various modifications, combinations, sub-combinations and alterations may occur depending on design requirements and other factors insofar as they are within the scope of the appended claims or the equivalents thereof.

What we claim is:

1. A semiconductor integrated circuit comprising:
    N (N indicates an integer larger than 2) number of modules set in their functions in accordance with input function setting data,
    a circuit block having R (R indicates an integer larger than 1, and smaller than N) number of input/output parts each of which outputs at least one signal to one module and receives at least one signal generated in that one module, and
    a module selection part for selecting R number of modules from among the N number of modules in accordance with an input control signal, connecting the selected R number of modules and the R number of input/output parts of the circuit block in a one-to-one correspondence, and connecting one module selected in response to a control signal from among at least two modules to each of the R number of input/output parts,
    each of the R number of input/output parts having a data holding part for holding a function setting data and inputting the held function, setting data to a destination module,
    the N number of modules able to replace functions of each other when the input function setting data are the same.

2. A semiconductor integrated circuit as set forth in claim 1, further comprising a control part for generating a signal for controlling the module selection part so that a faulty module among the N number of modules is disconnected from the R number of input/output parts.

3. A semiconductor integrated circuit as set forth in claim 1, wherein the data holding part includes
    a plurality of first interconnects for transmitting a plurality of bit data of the function setting data to a destination module and formed in a first layer,
    a plurality of second interconnects for transmitting the plurality of bit data and formed in a second layer different to the first layer, and
    a plurality of vias for connecting any one of the plurality of second interconnects to any one of the plurality of first interconnects.

4. A semiconductor integrated circuit as set forth in claim 3, wherein
    the first interconnects are formed in a first interconnect layer which is the first layer, and
    the second interconnects are formed in a second interconnect layer which is the second layer and intersected to the first interconnects at right angles.

5. A semiconductor integrated circuit as set forth in claim 1, wherein the data holding part includes a storage element enabling the stored data to be rewritten at least one time.

6. A semiconductor integrated circuit as set forth in claim 1, wherein each module includes a selection circuit for selecting one of a plurality of bit data of the function setting data in accordance with at least a part of the signal input from the input/output part and outputting that selected bit data or its logically inverted data to the input/output part.

7. A semiconductor integrated circuit comprising:
    a plurality of modules arranged in a matrix having M number of rows and (N+1) number of columns (M indicate an integer of 1 or more, and N indicates an integer larger than 1), each of which is set in a function in accordance with an input function setting data,
    a circuit block having a plurality of input/output parts arranged in matrix having M number of rows and N number of columns, each of which outputs at least one signal to one module and receives at least one signal generated in that one module, and
    a module selection part for selecting M number of rows and N number of columns of modules obtained by excluding one column from among the M number of rows and (N+1) number of columns of modules in response to an input control signal, connecting the selected M number of rows and N number of columns of modules and the M number of rows and N number of columns of input/output parts in a one-to-one correspondence, and connecting one module selected in response to a control signal from between two modules belonging to the same row to each of the input/output parts belonging to the same row,
    each of the M number of rows and N number of columns of input/output parts having a data holding part for holding a function setting data and inputting the held function setting data to a destination module, and
    the modules belonging to the same row able to replace functions of each other when the input function setting data are the same.

8. A semiconductor integrated circuit as set forth in claim 7, further comprising a control part for generating a control signal of the module selection part so as to select the M number of rows and N number of columns of modules excluding a column including a faulty module from among the M number of rows and the (N+1) number of columns of modules.

9. A semiconductor integrated circuit as set forth in claim 7, wherein the data holding part includes
    a plurality of first interconnects for transmitting bit data of a function setting data to a destination module and formed in a first layer
    a plurality of second interconnects for transmitting a plurality of bit data and formed in a second layer different to the first layer, and
    a plurality of vias for connecting any one of the plurality of second interconnects to any one of the plurality of first interconnects.

10. A semiconductor integrated circuit as set forth in claim 9, wherein
    the first interconnects are formed in a first interconnect layer which is the first layer,
    the second interconnects are formed in a second interconnect layer which is the second layer and intersected to the first interconnect layer at right angles.

11. A semiconductor integrated circuit as set forth in claim 7, wherein the data holding part includes a storage element enabling stored data to be rewritten at least one time.

12. A semiconductor integrated circuit as set forth in claim 7, wherein each module includes a selection circuit for selecting one of a plurality of bit data of the function setting data in accordance with at least a part of the signal input from the input/output part and outputting that selected bit data or its logically inverted data to the input/output part.

13. A semiconductor integrated circuit as set forth in claim 8, wherein the module selection part selects one of the modules of an i-th (i indicates an integer from 1 to N) column or modules of an (i+1)th column belonging to a k-th row (k indicates an integer from 1 to M) in response to a control signal and connects that selected module to the input/output part of the k-th row and the i-th column.

14. A semiconductor integrated circuit as set forth in claim 13, wherein
N number of input/output parts belonging to each row are arranged at equal intervals, and
the module in the k-th row and the i-th column and the module in the k-th row and the (i+1)th column are arranged at positions so that a distances from the input/output parts in the k-th row and the i-th column become equal to each other.

15. A semiconductor integrated circuit as set forth in claim 13, wherein the module selection part has a plurality of switch circuits connected to each of the M number of rows and the N number of columns of input/output parts;
2×N number of switch circuits connected to the N number of input/output parts of each row are grouped into
a first switch group including N number of switch circuits from a first switch circuit to an N-th switch circuit, and
a second switch group including the N number of switch circuits from a first switch circuit to an N-th switch circuit,
an i-th switch circuit belonging to the first switch group of the k-th row is connected between the input/output part in the k-th row and the i-th column and the module in the k-th row and the i-th column, and
an i-th switch circuit belonging to the second switch group of the k-th row is connected between the input/output part in the k-th row and the i-th column and the module in the k-th row and the (i+1)-th column.

16. A semiconductor integrated circuit as set forth in claim 15, wherein
when a control signal for instructing disconnection of modules belonging to an n-th row (n indicating an integer from 1 to (N+1)) from all input/output parts is input,
when n is an integer from 2 to N, the first switch circuit to (n−1)th switch circuit, belonging to the first switch group, are turned on and the n-th switch circuit to N-th switch circuit are turned off and the first switch circuit to (n−1)th switch circuit, belonging to the second switch group, are turned off and the n-th switch circuit to N-th switch circuit are turned on,
when n is the integer 1, all of the switch circuits belonging to the first switch group are turned off and all of the switch circuits belonging to the second switch group are turned on, and
when n is the integer (N+1), all of the switch circuits belonging to the first switch group are turned on and all of the switch circuits belonging to the second switch group are turned off.

17. A semiconductor integrated circuit as set forth in claim 16, wherein
when disconnecting the modules belonging to the n-th row from all of the input/output parts, a control part
sets a first control signal to the (n−1)th control signal to a first value and sets an n-th control signal to N-th control signal to a second value when n is an integer from 2 to N,
sets all of the first control signal to N-th control signal to the second value when n is the integer 1, and
sets all of the first control signal to N-th control signal to the first value when n is the integer (N+1), the i-th switch circuit belonging to the first switch group turns on when an i-th control signal of the control part is the first value and turns off when it is the second value, and
the i-th switch circuit belonging to the second switch group turns off when an i-th control signal of the control part is the first value and turns on when it is the second value.

18. A semiconductor integrated circuit as set forth in claim 15, wherein the switch circuit has
at least one first inverter circuit each having a terminal for receiving a signal from the input/output part and a terminal for outputting a signal to the module, logically inverting the signal input to the input terminal and outputting it from the output terminal when set on by a control signal, and setting the output terminal to a high impedance state when set off by the control signal, and
at least one second inverter circuit each having a terminal for receiving a signal from the module and a terminal for outputting a signal to the input/output part, logically inverting the signal input to the input terminal and outputting it from the output terminal when set on by a control signal, and setting the output terminal to a high impedance state when set off by the control signal.

19. A semiconductor integrated circuit as set forth in claim 18, wherein
each of the first inverter circuits and the second inverter circuits includes:
a first conductivity type first transistor and a second transistor connected in series between a first power line and the output terminal, and
a second conductivity type third transistor and a fourth transistor connected in series between a second power line and the output terminal;
one of the first transistor and the fourth transistor is driven on and the other is driven off in accordance with a signal input to an input terminal;
both of the second transistor and the third transistor are driven on or both are driven off in accordance with a control signal.

20. A semiconductor integrated circuit as set forth in claim 15, wherein each switch circuit has
a first transmission gate circuit inserted in a path transmitting a signal from the input/output part to the module and turning on or off in accordance with a control signal and
a second transmission gate circuit inserted in a path transmitting a signal from the module to the input/output part and turning on or off in accordance with a control signal.

21. A semiconductor integrated circuit as set forth in claim 15, wherein each switch circuit has
a fifth transistor inserted in a path transmitting a signal from the input/output part to the module and turning on or off in accordance with a control signal and
a sixth transistor inserted in a path transmitting a signal from the module to the input/output part and turning on or off in accordance with a control signal.

22. A semiconductor integrated circuit as set forth in claim 8, further comprising (N+1) number of power supply switch circuits each of which is inserted in a common power supply line of the M number of modules belonging to each column and shuts off a supply of power to modules belonging to columns not connected to the input/output parts in response to a control signal.

23. A semiconductor integrated circuit as set forth in claim 17, wherein the semiconductor integrated circuit further has (N+1) number of power switch circuits each inserted in a common power supply line of M number of modules belonging to one column;

the control part outputs N number of instruction signals from a first instruction signal to an N-th instruction signal and uses an i-th instruction signal to instruct whether to disconnect modules belonging to an i-th column from all input/output parts, a power switch circuit inserted into a power supply line of modules belonging to an i-th column turns off when the i-th instruction signal instructs disconnection of modules belonging to the i-th column from all input/output parts, and a power switch circuit inserted into a power supply line of modules belonging to an (N+1)th column turns off when the N-th control signal is a first value.

24. A semiconductor integrated circuit as set forth in claim 7, wherein the circuit block and the module selection part have wider intervals between interconnects belonging to the same interconnect layer in comparison with the M number of rows and (N+1) number of columns of modules.

25. A semiconductor integrated circuit as set forth in claim 7, wherein the circuit block and the module selection part have a larger number of vias used for connecting interconnects belonging to different interconnect layers in comparison with the M number of rows and (N+1) number of columns of modules.

26. A semiconductor integrated circuit as set forth in claim 7, wherein the M number of rows and the (N+1) number of columns of modules have a higher density of circuit elements per unit area in comparison with the circuit block and the module selection part.

27. A semiconductor integrated circuit as set forth in claim 8, further comprising a storage part for storing a signal designating modules of one column to be disconnected from the M number of rows and N number of columns of input/output parts, the control part generating a control signal in accordance with a signal stored in the storage part.

28. A semiconductor integrated circuit as set forth in claim 8, further comprising a signal input part for receiving as input a signal designating modules of one column to be disconnected from the above M number of rows and the N number of columns of input/output parts, the control part generating a control signal in accordance with the signal input to the signal input part when inspecting.

29. A semiconductor integrated circuit as set forth in claim 8, further comprising a storage part for storing a signal designating modules of one column to be disconnected from the M number of rows and N number of columns of input/output parts, and a signal input part for receiving a signal designating modules of one column to be disconnected from the above M number of rows and N number of columns of input/output parts, the control part generating the control signal in accordance with a signal input to the signal input part when inspecting, and storing a signal designating a series of modules to be disconnected in response to the result of the inspection.

30. A semiconductor integrated circuit as set forth in claim 7, wherein the module selection part connects a signal input terminal of a module disconnected from all input/output parts to an interconnect having a predetermined potential in response to the control signal.

31. A semiconductor integrated circuit comprising:

N (N indicates an integer larger than 2) number of modules set in their functions in accordance with input function setting data, a circuit means having R (R indicates an integer larger than 1, and smaller than N) number of input/output means each of which outputs at least one signal to one module and receives at least one signal generated in that one module, and a module selection means for selecting R number of modules from among the N number of modules in accordance with an input control signal, connecting the selected R number of modules and the R number of input/output means of the circuit means in a one-to-one correspondence, and connecting one module selected in response to a control signal from among at least two modules to each of the R number of input/output means, each of the R number of input/output means having a data holding means for holding a function setting data and inputting the held function setting data to a destination module, the N number of modules able to replace functions of each other when the input function setting data are the same.

32. A semiconductor integrated circuit comprising:

a plurality of modules arranged in a matrix having M number of rows and (N+1) number of columns (M indicate an integer of 1 or more, and N indicates an integer larger than 1), each of which is set in a function in accordance with an input function setting data, a circuit means having a plurality of input/output means arranged in matrix having M number of rows and N number of columns, each of which outputs at least one signal to one module and receives at least one signal generated in that one module, and a module selection means for selecting M number of rows and N number of columns of modules obtained by excluding one column from among the M number of rows and the (N+1) number of columns of modules in response to an input control signal, connecting the selected M number of rows and N number of columns of modules and the M number of rows and N number of columns of input/output means in a one-to-one correspondence, and connecting one module selected in response to a control signal from between two modules belonging to the same row to each of the input/output parts belonging to the same row, each of the M number of rows and the N number of columns of input/output means having a data holding part for holding a function setting data and inputting the held function setting data to a destination module, and the modules belonging to the same row able to replace functions of each other when the input function setting data are the same.

* * * * *

UNITED STATES PATENT AND TRADEMARK OFFICE
CERTIFICATE OF CORRECTION

PATENT NO. : 7,411,412 B2 Page 1 of 1
APPLICATION NO. : 11/499730
DATED : August 12, 2008
INVENTOR(S) : Tomofumi Arakawa et al.

It is certified that error appears in the above-identified patent and that said Letters Patent is hereby corrected as shown below:

Column 31, Line 33:
"function, setting," should read -- function setting --.

Column 31, Line 63:
"the," should be deleted.

Column 32, Lines 5 and 6:
"indicate," should read -- indicates --.

Column 33, Line 14:
"a distances," should read -- the distances --.

Column 34, Lines 34 and 35:
"indicate," should read -- indicates --.

Signed and Sealed this

Fourteenth Day of October, 2008

JON W. DUDAS
*Director of the United States Patent and Trademark Office*